(12) United States Patent
Fujii et al.

(10) Patent No.: US 8,349,634 B2
(45) Date of Patent: Jan. 8, 2013

(54) SEMICONDUCTOR DEVICE WITH SEALED CAP

(75) Inventors: Tetsuo Fujii, Toyohashi (JP); Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/801,845

(22) Filed: Jun. 29, 2010

(65) Prior Publication Data

US 2010/0270630 A1  Oct. 28, 2010

Related U.S. Application Data

(63) Continuation of application No. 12/068,771, filed on Feb. 12, 2008, now Pat. No. 7,859,091.

(30) Foreign Application Priority Data

Feb. 22, 2007 (JP) .................................. 2007-42619
Oct. 1, 2007 (JP) ................................. 2007-257840

(51) Int. Cl.
*H01L 21/00* (2006.01)

(52) U.S. Cl. ............ 438/48; 438/49; 438/106; 257/414; 257/684; 257/254; 257/E23.18

(58) Field of Classification Search .................. 257/414; 438/48
See application file for complete search history.

(56) References Cited

U.S. PATENT DOCUMENTS

| | | | |
|---|---|---|---|
| 6,228,675 B1 | 5/2001 | Ruby et al. | |
| 6,777,263 B1 | 8/2004 | Gan et al. | |
| 6,890,834 B2 | 5/2005 | Komobuchi et al. | |
| 6,892,575 B2 | 5/2005 | Nasiri et al. | |
| 6,936,491 B2 | 8/2005 | Partridge et al. | |
| 6,965,107 B2 | 11/2005 | Komobuchi et al. | |
| 7,045,868 B2 | 5/2006 | Ding et al. | |
| 7,247,246 B2 | 7/2007 | Nasiri et al. | |
| 7,560,802 B2 | 7/2009 | Kälvesten et al. | |
| 2003/0034535 A1 | 2/2003 | Barenburg et al. | |
| 2004/0077117 A1 | 4/2004 | Ding et al. | |
| 2004/0106294 A1 | 6/2004 | Lee et al. | |
| 2004/0112937 A1 | 6/2004 | Laermer | |
| 2004/0126920 A1 | 7/2004 | An et al. | |

(Continued)

FOREIGN PATENT DOCUMENTS

JP  A-4-98883  3/1992

(Continued)

OTHER PUBLICATIONS

"Replacement of crystal oscillator with MEMS oscillator formed by Si technique", *Nikkei Electronics*, Apr. 10, 2006, pp. 128-129 (partial English translation attached).

(Continued)

*Primary Examiner* — Ajay K Arora
(74) *Attorney, Agent, or Firm* — Posz Law Group, PLC

(57) ABSTRACT

A semiconductor device includes: a first substrate made of semiconductor and having first regions, which are insulated from each other and disposed in the first substrate; and a second substrate having electric conductivity and having second regions and insulation trenches. Each insulation trench penetrates the second substrate so that the second regions are insulated from each other. The first substrate provides a base substrate, and the second substrate provides a cap substrate. The second substrate is bonded to the first substrate so that a sealed space is provided between a predetermined surface region of the first substrate and the second substrate. The second regions include an extraction conductive region, which is coupled with a corresponding first region.

2 Claims, 22 Drawing Sheets

U.S. PATENT DOCUMENTS

| | | | |
|---|---|---|---|
| 2004/0245586 A1 | 12/2004 | Partridge et al. | |
| 2005/0023656 A1 | 2/2005 | Leedy | |
| 2005/0095833 A1 | 5/2005 | Lutz et al. | |
| 2005/0156260 A1 | 7/2005 | Partridge et al. | |
| 2005/0167795 A1 | 8/2005 | Higashi | |
| 2005/0170609 A1 | 8/2005 | Alie et al. | |
| 2005/0255645 A1 | 11/2005 | Lutz et al. | |
| 2005/0260783 A1 | 11/2005 | Lutz et al. | |
| 2006/0105503 A1 | 5/2006 | Ding et al. | |
| 2006/0211161 A1* | 9/2006 | Christenson et al. | 438/44 |
| 2006/0216856 A1 | 9/2006 | Zhao | |
| 2006/0216857 A1 | 9/2006 | Zhao | |
| 2006/0273430 A1 | 12/2006 | Hua et al. | |
| 2006/0292729 A1 | 12/2006 | Ohguro | |
| 2009/0068795 A1 | 3/2009 | Higashi | |

FOREIGN PATENT DOCUMENTS

| | | | |
|---|---|---|---|
| JP | A-10-92702 | | 4/1998 |
| JP | 10209470 A | * | 8/1998 |
| JP | A-2001-121500 | | 5/2001 |
| JP | A-2004-160654 | | 6/2004 |
| JP | A-2004-333133 | | 11/2004 |
| JP | A-2005-166909 | | 6/2005 |
| JP | A-2005-251898 | | 9/2005 |
| JP | A-2005-260099 | | 9/2005 |
| JP | A-2006-245396 | | 9/2006 |
| JP | A-2006-275660 | | 10/2006 |
| JP | A-2007-150098 | | 6/2007 |
| WO | WO 2005/045885 | | 5/2005 |

OTHER PUBLICATIONS

Office Action dated Dec. 9, 2008 in corresponding Japanese patent application No. 2007-257840 (and English translation).

Office Action dated Jun. 30, 2009 from the Japan Patent Office in the corresponding JP application No. 2007-257840 (and English Translation).

Office Action issued by the U.S. Patent Office on Apr. 1, 2010 in connection with related U.S. Appl. No. 12/068,771.

Court Hearing dated Jun. 29, 2010 in corresponding Japanese Application No. 2007-257840 (and English translation).

German Office Action issued from the German Patent Office on Jul. 5, 2010 in the corresponding German patent application No. 10 2008 000 261.5-33 (with English translation).

Notice of Allowance dated Sep. 17, 2010 issued in corresponding U.S. Appl. No. 12/068,771.

Office Action dated Jun. 28, 2011 in the corresponding German patent application No. 10 2008 000 261.5 (English translation enclosed).

Office Action mailed Feb. 14, 2012 in corresponding Japanese patent application No. 2009-225250 (English translation enclosed).

* cited by examiner

SEMICONDUCTOR DEVICE WITH SEALED CAP

CROSS REFERENCE TO RELATED APPLICATIONS

This application is a continuation of U.S. application Ser. No. 12/068,771 filed on Feb. 12, 2008. This application is based on Japanese Patent Applications No. 2007-42619 filed on Feb. 22, 2007, and No. 2007-257840 filed on Oct. 1, 2007, the disclosures of which are incorporated herein by reference.

FIELD OF THE INVENTION

The present invention relates to a semiconductor device and a method for manufacturing a semiconductor device.

BACKGROUND OF THE INVENTION

For example, JP-2004-333133 A (Patent Document 1) and U.S. Pat. No. 6,936,491 (Patent Document 2) each disclose a semiconductor device and its manufacturing method in which a sealing cap is provided for each of various elements formed on a surface layer of a semiconductor base substrate so as to protect the elements.

FIGS. 26A and 26B show a semiconductor device (inertia force sensor) disclosed in Patent Document 1. FIG. 26A is a top view of the inertia force sensor. FIG. 26B is a cross sectional view taken in the line XXVIB-XXVIB of FIG. 26A. In the following description, a horizontal direction in FIGS. 26A and 26B is assumed to be "lateral." A direction perpendicular to the lateral direction is assumed to be "longitudinal."

The inertia force sensor in FIGS. 26A and 26B is provided with a device layer 11. The device layer is formed integrally with a spring 1, an anchor 2, a beam 3, a mass unit 4, island electrodes 7a and 7b, and a frame 10. A bottom substrate 12 and a top substrate 13 are respectively bonded to bottom and top surfaces of the device layer 11. The device layer 11 is sealed between the substrates 12 and 13.

The island electrode 7a (electrode for movable electrode) electrically connects a movable electrode 5 to the outside. The island electrode 7b (electrode for fixed electrode) electrically connects a fixed electrode 6 to the outside. Top surfaces of the island electrodes 7a and 7b are provided with electrode pads 8 for electrical connection with external devices. The top substrate 13 is provided with through holes 9 corresponding to the electrode pads 8. The electrode pads 8 are exposed outward. Though not shown, the electrode pads 8 are electrically connected to external ICs etc. via wire bonding through the through holes 9.

On the inertia force sensor as shown in FIGS. 26A and 26B, the anchor 2 is fixed (bonded) to the bottom substrate 12. The island electrodes 7a and 7b and the frame 10 are fixed (bonded) to the substrates 12 and 13. The spring 1, the beam 3, and the mass unit 4 are not connected to the substrates 12 and 13. Each beam 3 is supported by the corresponding anchor 2. The mass unit 4 is supported by two beams 3 laterally and displaceably. The spring 1 correspondingly connects the anchor 2 with the island electrode 7a. The spring 1 also connects the anchor 2 with the island electrode 7a electrically.

When viewed longitudinally, both sides of the mass unit 4 are provided with the movable electrodes 5. The fixed electrode 6 is provided for the island electrode 7b for fixed electrode. At both sides of the mass unit 4, the movable electrode 5 and the fixed electrode 6 laterally face to each other. When an inertia force is laterally applied to the inertia force sensor, the inertia force laterally moves the mass unit 4 and changes the lateral position relationship (interval) between the movable electrode 5 and the fixed electrode 6. Changing the interval also changes a capacitance between the movable electrode 5 and the fixed electrode 6. A capacitance change can be used to detect the inertia force applied to the inertia force sensor.

The inertia force sensor in FIGS. 26A and 26B uses the island electrodes 7a and 7b that are electrically insulated from each other. The movable electrode 5 provided for the mass unit 4 is electrically connected to the island electrode 7a for movable electrode via the beam 3, the anchor 2, and the spring 1 in order. The island electrode 7a is electrically connected to an external IC etc. via the electrode pad 8 on the top surface of the island electrode 7a and the wire bonding (not shown) through the through hole 9. The fixed electrode 6 for fixed electrode is provided for the island electrode 7b. The fixed electrode 6 is electrically connected to an external IC or elsewhere via the island electrode 7b, the electrode pad 8 thereon, and the wire bonding (not shown) through the through hole 9.

As mentioned above, the inertia force sensor in FIGS. 26A and 26B uses the wire bonding to the electrode pads 8 on the island electrodes 7a and 7b via the through holes 9 in the top substrate 13 for electrical connection to an external IC etc. However, the wire bonding requires the through hole 9 large enough for a bonding tool to avoid contact with the top substrate 13. The chip size accordingly increases to cause a cost problem. As seen from FIG. 26B, the above-mentioned structure makes face down bonding (ball bonding) difficult, causing mounting restrictions.

Thus, It is required for a semiconductor device in which a sealing cap is provided for various elements formed on a surface layer of a semiconductor base substrate so as to protect the elements, inexpensively manufacture a small device, enable face down bonding, and reduce mounting restrictions.

SUMMARY OF THE INVENTION

In view of the above-described problem, it is an object of the present disclosure to provide a semiconductor device. It is another object of the present disclosure to provide a method for manufacturing a semiconductor device.

According to a first aspect of the present disclosure, a semiconductor device includes: a first substrate made of semiconductor and having a plurality of first regions, wherein the first regions are insulated from each other and disposed in a surface portion of the first substrate, and wherein each first region is a semiconductor region; and a second substrate having electric conductivity and having a plurality of second regions and a plurality of insulation trenches, wherein each insulation trench penetrates the second substrate so that the second regions are insulated from each other, and wherein each second region is a conductive region. The first substrate provides a base substrate, and the second substrate provides a cap substrate. The second substrate is bonded to the first substrate so that a sealed space is provided between a predetermined surface region of the first substrate and the second substrate, and the second regions include an extraction conductive region, which is coupled with a corresponding first region.

In the device, the cap substrate covers and protects the predetermined surface region of the first substrate, on which various elements are to be formed. One side of the extraction conductive region is bonded to the first region, and the other side of the extraction conductive region is exposed to the outside of the device so that, for example, a bonding wire or a face down bonding member (i.e., a bonding ball) may be connected to the other side of the extraction conductive region. Thus, various elements on the first region can be coupled with an external circuit through the extraction conductive region without forming a through hole for the bonding wire. Accordingly, dimensions of the device can be minimized, and a manufacturing cost of the device is reduced. Further, the second substrate is not a layer on the first substrate but an independent substrate. Accordingly, a thickness of the second substrate can be set appropriately so that strength of the second substrate can be secured. Further, the second substrate can be easily processed by a conventional processing method, so that the manufacturing cost of the device is also reduced.

According to a second aspect of the present disclosure, a method for manufacturing a semiconductor device includes: preparing a first substrate made of semiconductor, wherein the first substrate includes a plurality of first regions, which are insulated from each other and disposed in a surface portion of the first substrate, and wherein each first region is a semiconductor region; preparing a second substrate having electric conductivity and including a plurality of second regions and a plurality of insulation trenches, wherein each insulation trench penetrates the second substrate so that the second regions are insulated from each other, and wherein each second region is a conductive region; bonding the second substrate to the first substrate so that a sealed space is formed between a predetermined surface region of the first substrate and the second substrate; and electrically coupling one of the second regions and a corresponding one of the first regions so that the one of the second regions provides an extraction conductive region. The first substrate provides a base substrate, and the second substrate provides a cap substrate.

The above method provides the semiconductor device, dimensions of which can be minimized, and a manufacturing cost of the device is reduced. Further, strength of the second substrate can be secured. Further, the second substrate can be easily processed by a conventional processing method, so that the manufacturing cost of the device is also reduced.

BRIEF DESCRIPTION OF THE DRAWINGS

The above and other objects, features and advantages of the present invention will become more apparent from the following detailed description made with reference to the accompanying drawings. In the drawings:

FIGS. 8A and 8B show a base substrate B10 of the semiconductor device 110, in which FIG. 8A is a cross sectional view of the base substrate B10 and FIG. 8B is a top view thereof;

FIGS. 9A and 9B show a cap substrate C10 of the semiconductor device 110, in which FIG. 9A is a cross sectional view of the cap substrate C10 and FIG. 9B is a top view of the cap substrate C10;

FIGS. 10A to 10D are cross sectional views exemplifying the manufacturing method for the semiconductor device 110 corresponding to processes, in which FIGS. 10A to 10D show processes of preparing the base substrate B10 before being bonded to the cap substrate C10 of the semiconductor device 110;

FIGS. 11A to 11C are cross sectional views exemplifying the manufacturing method for the semiconductor device 110 corresponding to processes, in which FIGS. 11A to 11C show processes of preparing the cap substrate C10 before being bonded to the base substrate B10 of the semiconductor device 110;

FIGS. 12A and 12B are cross sectional views exemplifying the manufacturing method for the semiconductor device 110 corresponding to processes, in which FIGS. 12A and 12B show a substrate bonding process of bonding the base substrate B10 to the cap substrate C10 prepared in the preceding processes;

FIGS. 16A to 16D show a method of manufacturing the semiconductor device 112, in which FIGS. 16A to 16D are cross sectional views showing processes of preparing a cap substrate C11 before being bonded to the base substrate B1;

FIGS. 17A and 17B show a method of manufacturing the semiconductor device 112, in which FIGS. 17A and 17B show processes of bonding the base substrate B1 to the cap substrate C11;

FIGS. 20A to 20C exemplify the semiconductor device having an infrared sensor element, in which FIG. 20A is a schematic cross sectional view of a semiconductor device 102, FIG. 20B is an enlarged view around the infrared sensor element enclosed by a broken line F in FIG. 20A, and FIG. 20C is a schematic top view showing a partial layout of FIG. 20B;

FIGS. 25A and 25B illustrate yet another modification of the cap substrate, in which FIG. 25A shows a schematic cross sectional view of a semiconductor device 106 using a cap substrate C8 and FIG. 25B shows a primary substrate C8a for a cap substrate preparation process before forming the cap substrate C8; and FIGS. 26A and 26B show a conventional semiconductor device (inertia force sensor), in which FIG. 26A is a top view of the inertia force sensor and FIG. 26B is a cross sectional view taken in the line XXVIA-XXVIA of FIG. 26A.

DETAILED DESCRIPTION OF THE PREFERRED EMBODIMENTS

First Embodiment

Figure 1:
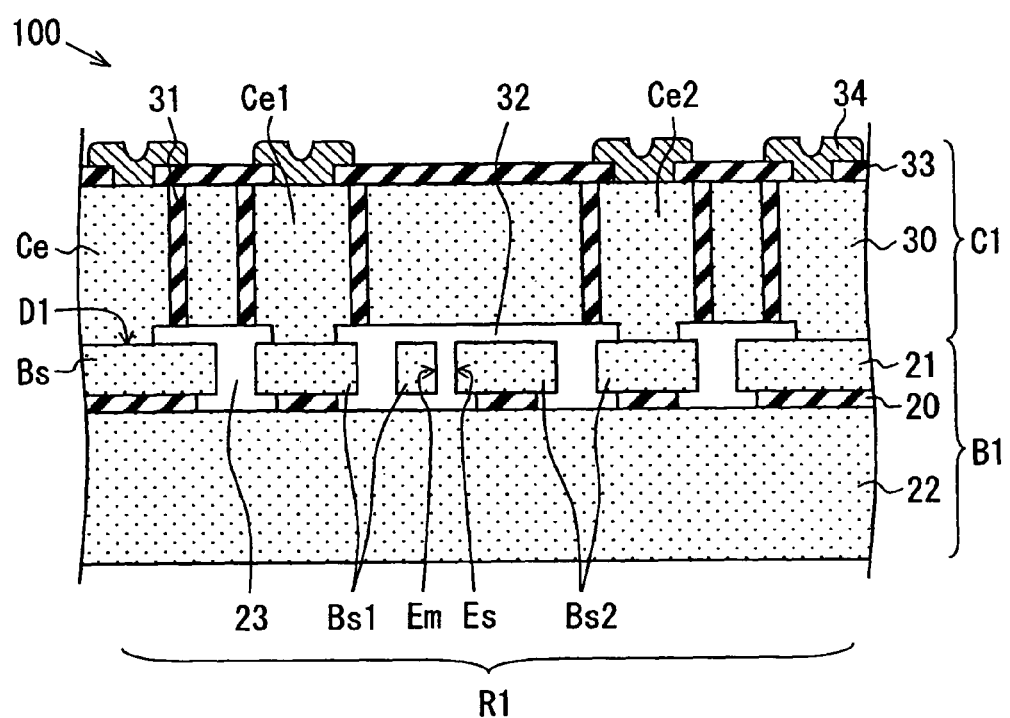
FIG. 1 is a cross sectional view of a semiconductor device 100 as an example of the semiconductor device according to an embodiment.

FIG. 1 is a cross sectional view of a semiconductor device 100 as an example of the semiconductor device according to an embodiment.

The semiconductor device 100 in FIG. 1 includes a semiconductor base substrate B1 and a conductive cap substrate C1 bonded to the base substrate B1.

The base substrate B1 of the semiconductor device 100 in FIG. 1 is an SOI (Silicon On Insulator) substrate including an embedded oxide film 20. The base substrate B1 includes the embedded oxide film 20 sandwiched between an SOI layer 21 and a support substrate 22. Insulated and separated multiple base semiconductor regions Bs are formed on a surface layer of the base substrate B1. The base semiconductor region Bs of the semiconductor device 100 in FIG. 1 belongs to the SOI layer 21 and is insulated and separated from adjacencies by a trench 23 that reaches the embedded oxide film 20.

Figure 26A:
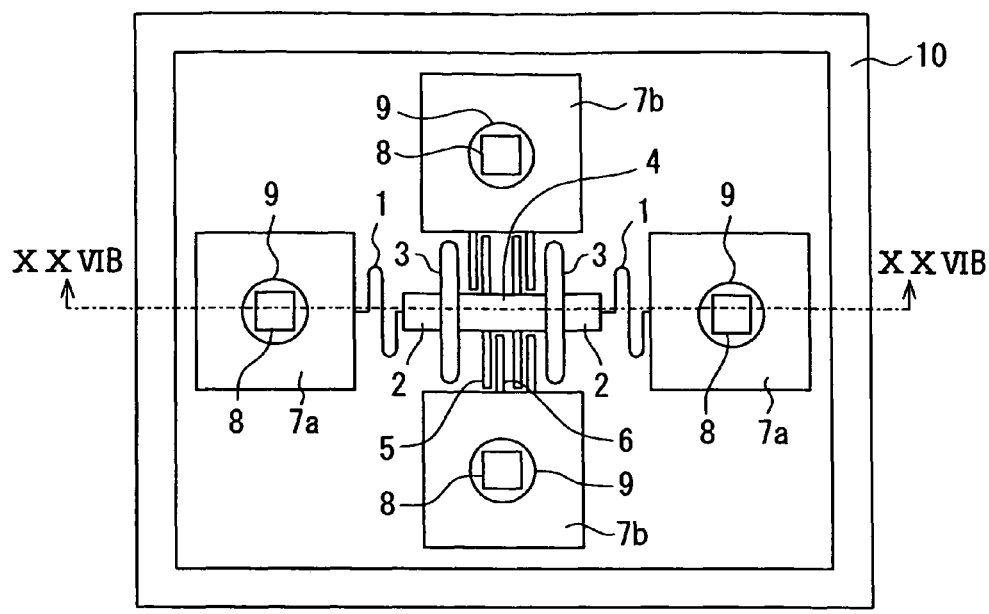
Figure 26B:
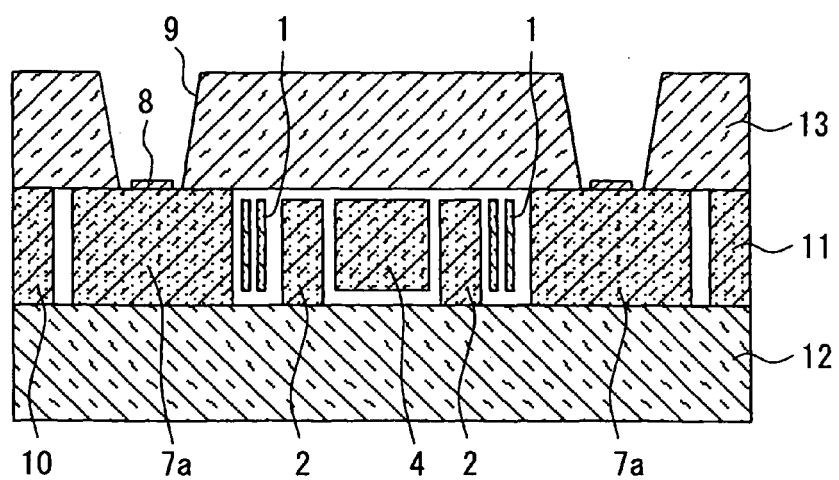

The semiconductor device 100 in FIG. 1 is similar to the semiconductor device (inertia force sensor) in FIGS. 26A and 26B and includes a mechanical quantity sensor element using an inertia force. Multiple base semiconductor regions Bs are formed on the surface layer of the base substrate B1 to construct the mechanical quantity sensor element for measuring accelerations and angular velocities. In FIG. 1, a base semiconductor region Bs1 belongs to the base semiconductor regions Bs for the base substrate B1. The base semiconductor region Bs1 is a movable semiconductor region and is formed by performing sacrifice layer etching on part of the embedded oxide film 20. The base semiconductor region Bs1 includes a displaceably formed movable electrode Em. Another base semiconductor region Bs2 in FIG. 1 is a fixed semiconductor region including a fixed electrode Es opposite to the movable electrode Em. Viewed from the top, the mechanical quantity sensor element of the semiconductor device 100 is structured similarly to that in FIGS. 26A and 26B and is not diagramed in FIG. 1. The cross sectional view of FIG. 1 shows two movable semiconductor regions Bs1 and two fixed semiconductor regions Bs2. Viewed from the top, the two regions each form a continuous unity. The semiconductor device 100 forms a capacitance between opposite faces for the movable electrode Em of the movable semiconductor region Bs1 and the fixed electrode Es of the fixed semiconductor region Bs2. The movable electrode Em is displaced perpendicularly to the opposite surface in accordance with the applied mechanical quantity. The capacitance changes in accordance with a change in the distance between the movable electrode Em and the fixed electrode Es. The capacitance change is measured to detect the applied mechanical quantity.

Here, in the following feature, a part other than a circuit formation region may be made of single crystal silicon or poly crystal silicon.

As shown in FIG. 1, the cap substrate C1 of the semiconductor device 100 includes a single-crystal silicon substrate 30 where multiple cap conductive regions Ce are formed. The cap conductive regions Ce are separated by an insulating and separating trench 31 that pierces the cap substrate C1 (single-crystal silicon substrate 30). The cap substrate C1 includes a recess 32 that faces a specified area R1 of the surface layer on the base substrate B1. Of the cap substrate C1, the reference numeral 33 denotes a surface protection layer made of silicon oxide ($SiO_2$) etc. The reference numeral 34 denotes an electrode pad made of aluminum (Al) etc.

As shown in FIG. 1, the cap substrate C1 is provided with the recess 32 so as to cover the movable electrode Em of the base substrate B1. The cap substrate C1 is bonded to the base substrate B1 around the recess 32 to form a bonding surface D1. The bonding surface D1 between the base substrate B1 and the cap substrate C1 is formed so as to be circular in the specified area R1 of the base substrate B1. When the base substrate B1 and the cap substrate C1 are bonded, spaces 23 and 32 are formed between the surface of the specified area R1 of the base substrate B1 and the recess 32 of the cap substrate C1. The spaces 23 and 32 are sealed to be highly vacuum. After bonding the substrates as mentioned above, specified cap conductive regions Ce1 and Ce2 in FIG. 1 function as leading conductive regions electrically connected to the base semiconductor regions Bs1 and Bs2, respectively. The leading conductive regions Ce1 and Ce2 are connected to the movable semiconductor region Bs1 and the fixed semiconductor region Bs2 of the base substrate B1, respectively.

On the semiconductor device 100 in FIG. 1, the conductive cap substrate C1 is bonded to the base substrate B1 and functions as a sealing cap for protecting the mechanical quantity sensor element formed on the specified area R1 of the surface layer for the base substrate B1.

The insulated and separated cap conductive regions Ce are formed on the cap substrate C1. The specified cap conductive regions Ce1 and Ce2 are electrically connected to the specified insulated and separated base semiconductor regions Bs1 and Bs2 formed on the base substrate B1. The cap conductive regions Ce1 and Ce2 function as leading conductive regions. The semiconductor device 100 in FIG. 1 enables electric connection such as wire bonding to the leading conductive regions Ce1 and Ce2 (corresponding electrode pads 34) externally exposed from the surface opposite to the bonding surface between the base substrate B1 and the cap substrate C1. This is a difference from the conventional semiconductor device as shown in FIG. 26B. In this manner, the semiconductor device 100 in FIG. 1 can make electric connection to the mechanical quantity sensor elements formed on the specified area R1 of the surface layer for the base substrate B1 via the leading conductive regions Ce1 and Ce2. Differently from the conventional semiconductor device in FIG. 26A, the semiconductor device 100 in FIG. 1 need not form a large through hole in the cap substrate for wire bonding. Since the chip size can be reduced, the semiconductor device can be miniaturized and inexpensively manufactured. Further, the semiconductor device 100 can use face down bonding (ball bonding) for electric connection to the leading conductive regions Ce1 and Ce2 (corresponding electrode pads 34) exposed outside the cap substrate C1 and reduce mounting restrictions.

The cap substrate C1 of the semiconductor device 100 is not deposited on the base substrate B1 but is formed by processing a single substrate, as will be described later. For example, the cap substrate can have any thickness, making it possible to ensure high strength. A general substrate process method can be used to easily form various structures (to be described) on the cap substrate C1. Manufacturing costs can be decreased to provide an inexpensive semiconductor device compared to a case of forming the sealing cap as a deposit layer on the base substrate B1, for example.

As mentioned above, the semiconductor device 100 protects the mechanical quantity sensor element formed on the surface layer of the semiconductor base substrate B1. The semiconductor device 100 includes the sealing cap (substrate) C1 provided on the mechanical quantity sensor element of the base substrate B1. The semiconductor device 100 can be inexpensively manufactured to be small-sized and is capable of face down bonding to reduce mounting restrictions.

The following describes a method of manufacturing the semiconductor device 100 in FIG. 1. FIGS. 2A to 6B are cross sectional views of the semiconductor device 100 corresponding to processes of an example method of manufacturing the semiconductor device 100.

Figure 2A:
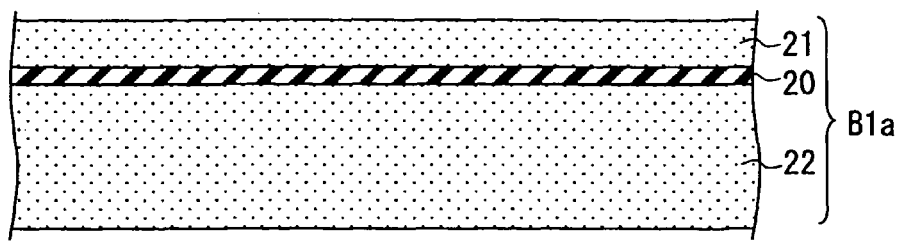
FIGS. 2A to 2C show a process of preparing the base substrate, which is to prepare the base substrate B1 to be bonded to the cap substrate C1 of the semiconductor device 100 in FIG. 1.
Figure 2B:
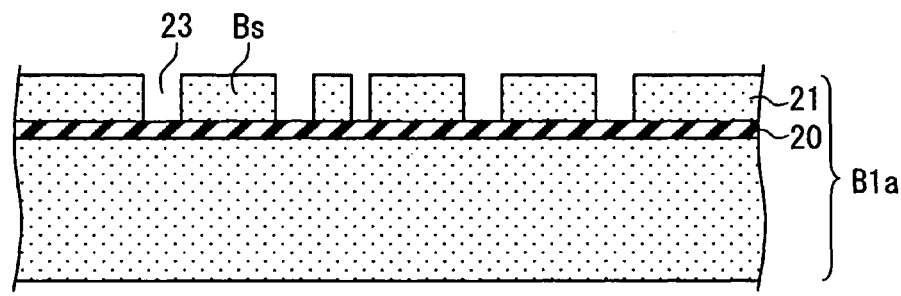
Figure 2C:
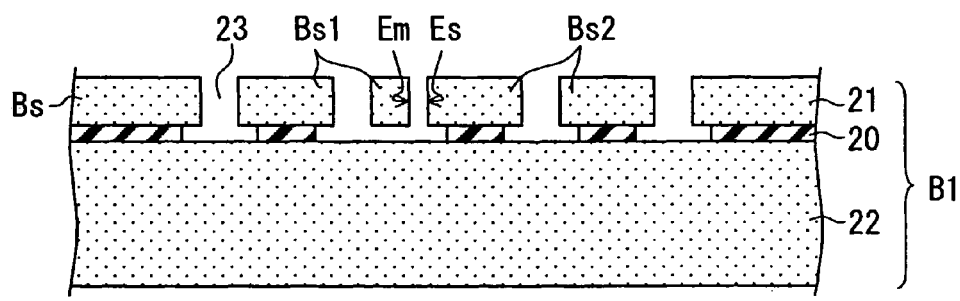

FIGS. 2A to 2C show a process of preparing the base substrate. The process is to prepare the base substrate B1 to be bonded to the cap substrate C1 of the semiconductor device 100 in FIG. 1.

As shown in FIG. 2A, an SOI substrate B1a is prepared first. The SOI substrate B1a includes the embedded oxide film 20 sandwiched between the SOI layer 21 and the support substrate 22. For example, a substrate bonding technology is used to form the SOI substrate B1a. The embedded oxide film 20 is a silicon oxide ($SiO_2$) film. The support substrate 22 is a single-crystal silicon substrate with the specific resistance of 0.001 Ωcm to 1 Ωcm. The SOI layer 21 is used for forming various elements. The SOI layer 21 is a highly-concentrated single-crystal silicon layer containing arsenic (As), phosphorus (P), etc. with a thickness of one to 50 μm and a specific resistance of 0.001 Ωcm to 1 Ωm. The thickness of the SOI layer is 10 μm to 20 μm for the semiconductor device 100 in FIG. 1 where the mechanical quantity sensor element is formed. In FIG. 1, part of the base semiconductor region Bs is used as the movable semiconductor region Bs1 and the fixed semiconductor region Bs2 where the movable electrode Em and the fixed electrode Es are formed respectively. In particular, the SOI layer 21 preferably has as high an impurity density as possible, i.e., a small specific resistance.

As shown in FIG. 2B, the photolithography and deep etching techniques are used to form the trench 23 that has an approximately perpendicular wall and reaches the embedded oxide film 20. The trench 23 divides the SOI layer 21 to form multiple base semiconductor regions Bs insulated and separated from adjacencies. The base semiconductor regions Bs are formed on the surface layer of the SOI substrate B1a.

As shown in FIG. 2C, hydrogen fluoride (HF) gas is used to partially etch the embedded oxide film 20 made of $SiO_2$ through the trench 23. The etching forms the movable semiconductor region Bs1 having the movable electrode Em, the fixed semiconductor region Bs2 having the fixed electrode Es, etc. The etching needs to be performed to completely remove the embedded oxide film 20 below the movable electrode Em of the movable semiconductor region Bs1 as shown in FIG. 2C.

In this manner, the process in FIGS. 2A to 2C prepares the base substrate B1 to be bonded to the cap substrate C1.

FIGS. 3A to 3D and FIGS. 4A to 4D exemplify processes of preparing the cap substrate C1 to be bonded to the base substrate B1 in FIG. 1.

Figure 3A:
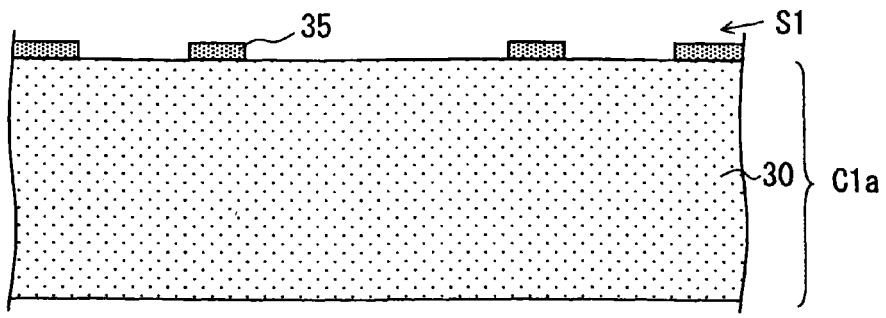
FIGS. 3A to 3D exemplify processes of preparing the cap substrate C1 to be bonded to the base substrate B1 in FIG. 1.
Figure 3B:
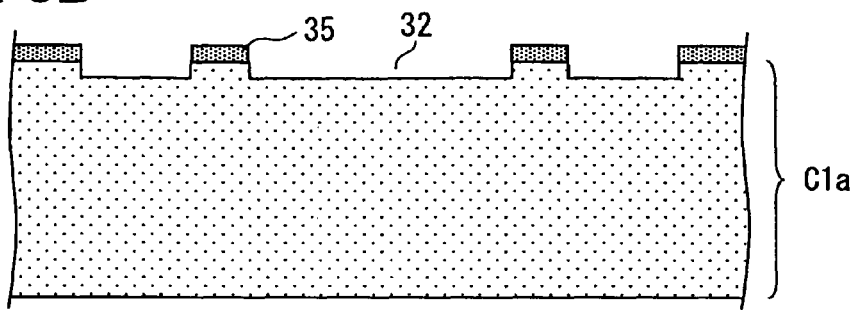

The process in FIGS. 3A and 3B forms the recess 32 in FIG. 1 on surface S1, i.e., one side of a primary substrate C1a that is to be formed into the cap substrate C1. The surface S1 is to be bonded to the base substrate B1.

As shown in FIG. 3A, the primary substrate C1a is prepared. For example, the primary substrate C1a includes the single-crystal silicon substrate 30 that contains highly-concentrated arsenic (As) and phosphorus (P) according to the crystal orientation (100) and has the specific resistance of 0.001 Ωcm to 1 Ωcm. When part of the cap conductive region Ce in FIG. 1 is used as the leading conductive regions Ce1 and Ce2, the single-crystal silicon substrate 30 preferably has as high an impurity density as possible, i.e., a small specific resistance. The thermal oxidation is then performed to form the silicon oxide ($SiO_2$) film 35 with a thickness of 0.1 μm to 1 μm. The photolithography and etching techniques are then used to partially remove the $SiO_2$ film 35 for a specified pattern. As shown in FIG. 3B, the specifically patterned $SiO_2$ film 35 is used to dry-etch the primary substrate C1a and form the recess 32 as deep as 0.1 μm to 10 μm.

Figure 3C:
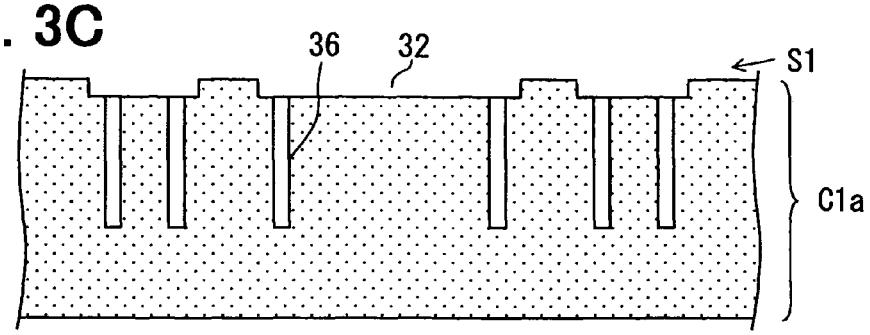
Figure 3D:
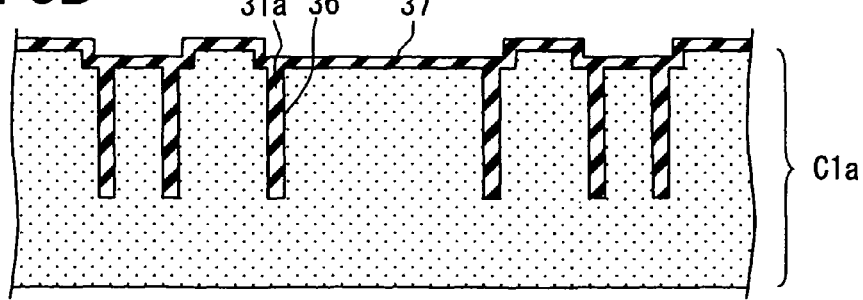
Figure 4A:
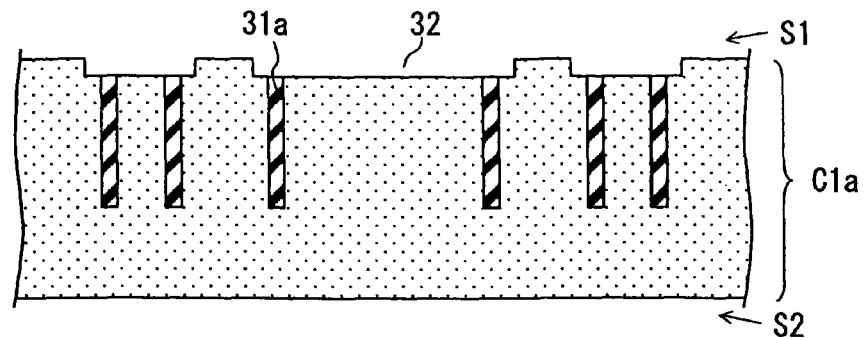
FIGS. 4A to 4D exemplify processes of preparing the cap substrate C1 to be bonded to the base substrate B1 in FIG. 1.

FIGS. 3C and 3D and FIG. 4A show a primary insulating trench formation process. A primary insulating trench 31a is formed with a given depth on the S1 side of the primary substrate C1a where the recess 32 is formed. The primary insulating trench 31a is to be formed into the insulating and separating trench 31 in FIG. 1.

After removal of the $SiO_2$ 35 as shown in FIG. 3C, a specifically patterned mask is re-formed on the S1 side of the primary substrate C1a. The photolithography and deep etching techniques are used to form a trench 36 having an approximately perpendicular wall in the same manner as forming the trench 23 on the SOI substrate B1a in FIG. 2B. As shown in FIG. 3D, the thermal oxidation is then performed to form a silicon oxide ($SiO_2$) film 37. The trench 36 is embedded with the $SiO_2$ film 37 to form the primary insulating trench 31a. Instead of the thermal oxidation, a CVD (Chemical Vapor Deposition) technique etc. may be used to embed the trench 36 with the $SiO_2$ film 37 to form the primary insulating trench 31a.

As shown in FIG. 4A, the dry etching technique is used for etch back to remove the $SiO_2$ film 37 from the primary substrate C1a in FIG. 3D so that the $SiO_2$ film remains only in the primary insulating trench 31a.

Figure 4B:
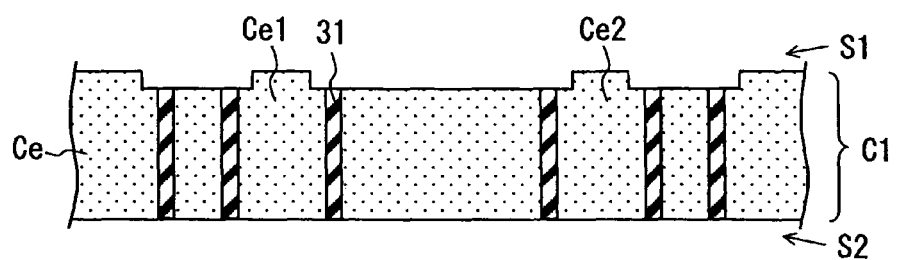

A cap substrate formation process in FIG. 4B thins the primary substrate C1a by grinding it from the surface S2 thereof until an edge of the primary insulating trench 31a is exposed. The process forms the primary substrate C1a into the cap substrate C1 having the specified thickness as shown in FIG. 1. The process forms the primary insulating trench 31a into the insulating and separating trench 31 that pierces the cap substrate C1 in FIG. 1. The process simultaneously forms multiple cap conductive regions Ce on the cap substrate C1. The cap conductive regions Ce are insulated and separated by the insulating and separating trench 31 and are partially used as the leading conductive regions Ce1 and Ce2 for electrical connection with the base substrate B1. The primary substrate C1a may be thinned by not only grinding but also abrasion, etching, and a combination of these.

Figure 4C:
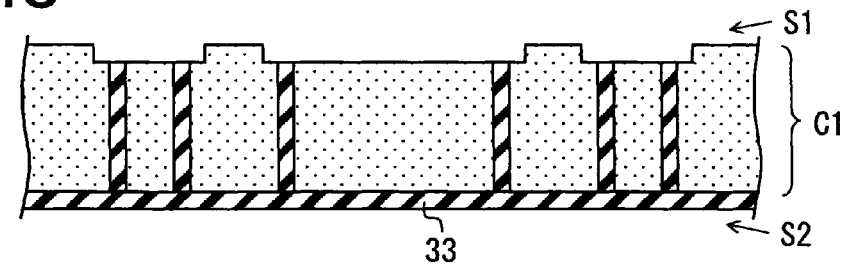

As shown in FIG. 4C, the CVD technique is used to form an $SiO_2$ film as a surface protection layer 33 in FIG. 1 on the surface S2 of the cap substrate C1. Instead of the CVD technique, the thermal oxidation etc. may be used to form the $SiO_2$ film 33. In this case, an etch back technique needs to be used to remove the $SiO_2$ film formed on the surface S1 of the cap substrate C1.

Figure 4D:
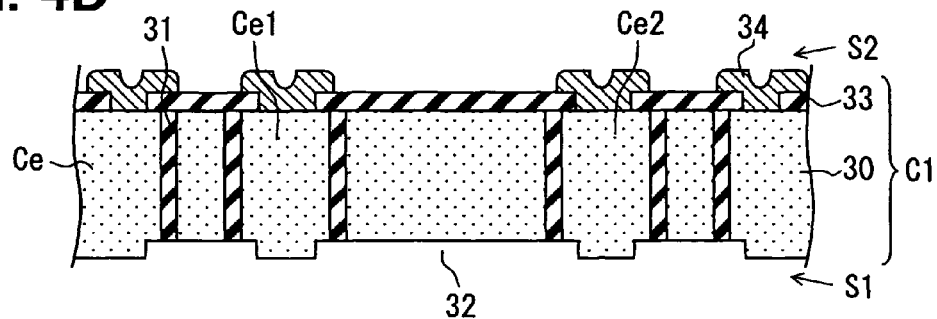

FIG. 4D shows the cap substrate C1 upside down. A contact hole is formed in the $SiO_2$ film 33 formed on the surface S2 of the cap substrate C1. The contact hole is used for electric connection with the single-crystal silicon substrate 30. For example, the sputtering technique etc. is used to deposit an aluminum (Al) film which is then patterned to form an electrode pad 34 and a wiring layer (not shown). The electrode pad 34 may be formed over the contact hole. Alternatively, the electrode pad 34 may be formed at any position with a wiring (not shown).

The processes in FIGS. 3 and 4 prepare the cap substrate C1 having the surface S1 as a bonding surface to be bonded to the base substrate B1.

FIGS. 5A to 5D exemplify another preparation process for the cap substrate C1.

Figure 5A:
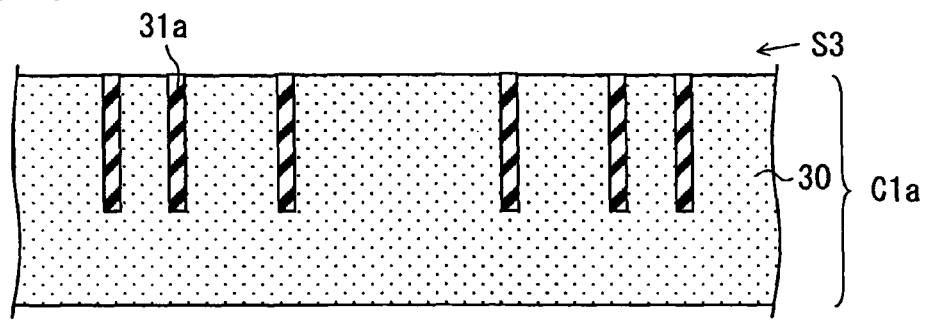
FIGS. 5A to 5D exemplify another preparation process for the cap substrate C1.

A primary insulating trench formation process in FIG. 5A prepares the primary substrate C1a to be formed into the cap substrate C1 including the single-crystal silicon substrate 30. The techniques described for FIGS. 3C, 3D, and 4A are used to form the primary insulating trench 31a having a specified depth on a surface S3 of the primary substrate C1a. The primary insulating trench 31a is to be formed into the insulating and separating trench 31 in FIG. 1.

Figure 5B:
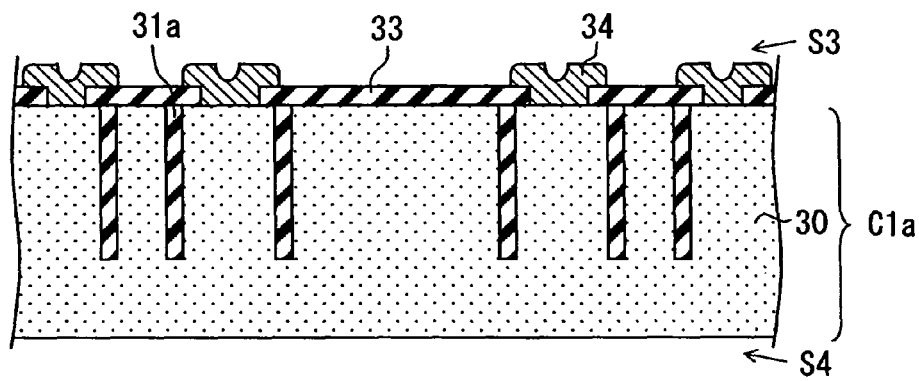

As shown in FIG. 5B, the techniques described for FIGS. 4C and 4D are used to form the $SiO_2$ 33 formed into the surface protection layer 33 in FIG. 1, the electrode pad 34, and the wiring layer (not shown) on the surface S3 of the primary substrate C1a.

Figure 5C:
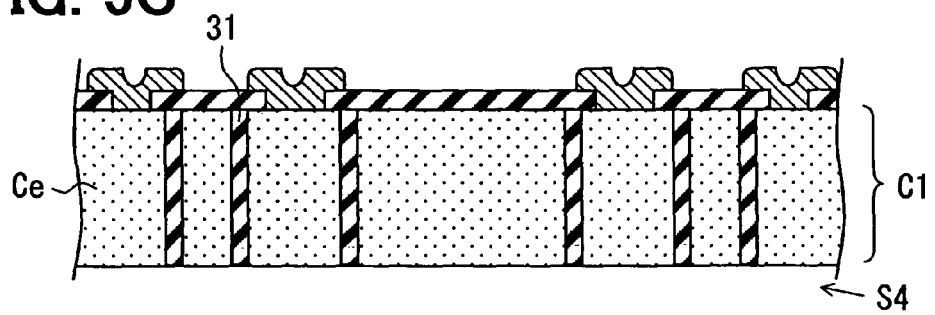

A cap substrate formation process in FIG. 5C grinds the primary substrate C1a from the surface S4 to expose an edge of the primary insulating trench 31a. The primary insulating trench 31a is formed into the insulating and separating trench 31. The primary substrate C1a is formed into the cap substrate C1. The cap conductive regions Ce are insulated and separated by the insulating and separating trench 31 and are formed on the cap substrate C1 at the same time.

Figure 5D:
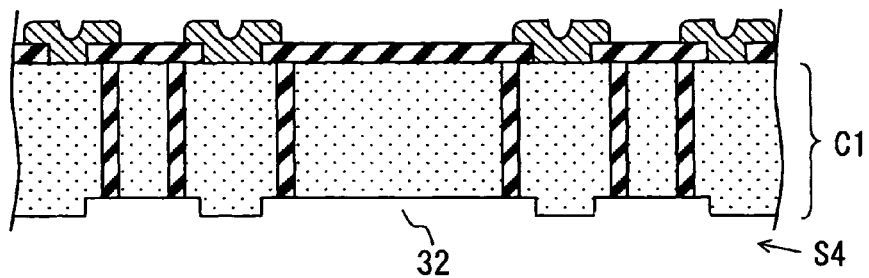

A recess formation process in FIG. 5D forms the recess 32 on the surface S4 of the cap substrate C1.

The processes in FIGS. 5A to 5D prepare the cap substrate C1 having the bonding surface on the surface S4 to be bonded to the base substrate B1.

Figure 6A:
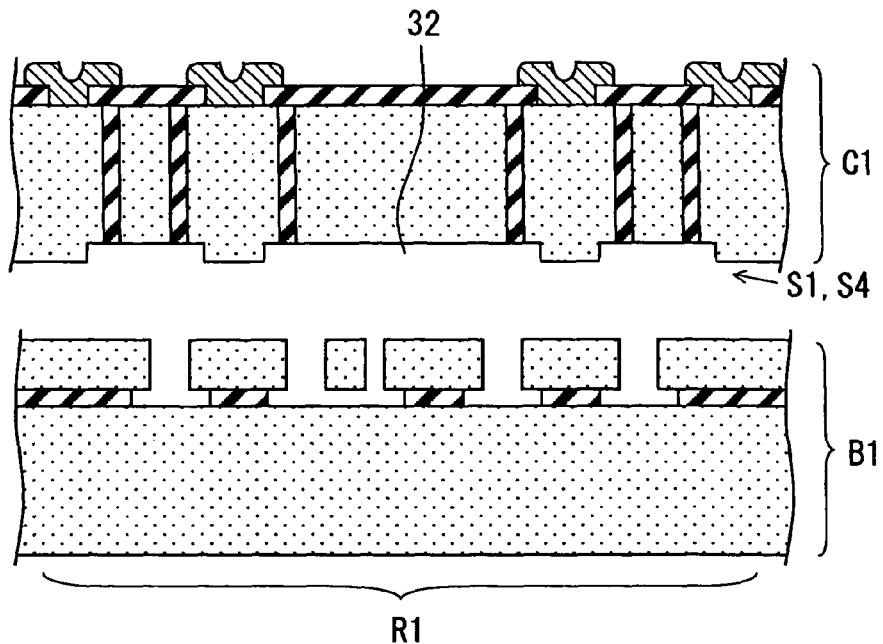
FIGS. 6A and 6B illustrate a substrate bonding process and show the process of bonding the base substrate B1 and the cap substrate C1 prepared in the preceding processes.
Figure 6B:
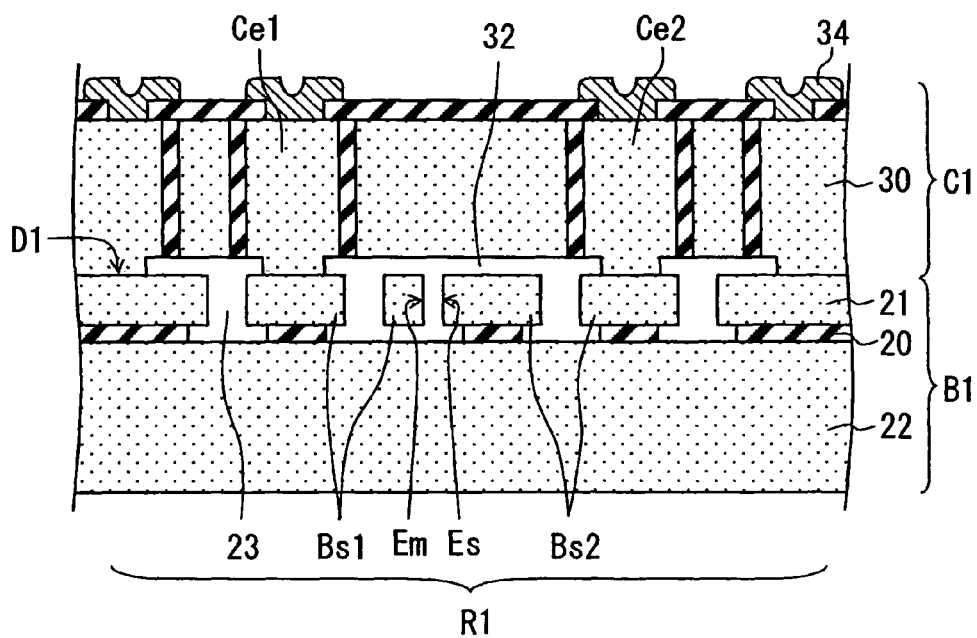

A substrate bonding process in FIGS. 6A and 6B bonds the base substrate B1 to the cap substrate C1 prepared in the preceding processes.

As shown in FIG. 6A, both substrates are positioned so that the recess 32 of the cap substrate faces the specified area R1 of the base substrate B1 where the mechanical quantity sensor element is formed. As shown in FIG. 6B, the cap substrate C1 is bonded to the base substrate B1 around the recess 32. Silicon (Si) fusion bonding can be used between the base substrate B1 and the cap substrate C1 because both substrates are made of silicon. The Si fusion bonding can tightly bond the base substrate B1 and the cap substrate C1 by ensuring the conductivity on the bonding surface D1. The Si fusion bonding can also completely seal the spaces 23 and 32 formed by the surface of the specified area R1 on the base substrate B1 and the surface of the recess 32 on the cap substrate C1.

The Si fusion bonding may be conducted at a high temperature between 800 and 1200° C. or at normal temperature between the room temperature and 500° C. The latter is more preferable. The semiconductor device 100 in FIG. 1 includes the mechanical quantity sensor element designed for a tiny quantity of signal output and measures an acceleration or angular velocity output using a capacitance change based on a displacement between the opposite electrodes Em and Es. Manufacturing a high-accuracy mechanical quantity sensor element requires minimizing a thermal stress generated on the base substrate B1 due to bonding to the cap substrate C1. Accordingly, the bonding approximate to the room temperature is preferable. When bonding the base substrate B1 to the cap substrate C1, the Si fusion bonding at normal temperature causes fewer temperature restrictions on manufacturing processes than that at a high temperature. For example, various elements can be formed on the base substrate B1 and the cap substrate C1 before they are bonded to each other.

The following describes how the Si fusion bonding is specifically conducted at normal temperature to bond the base substrate B1 and the cap substrate C1 to each other as shown in FIGS. 6A and 6B. After the base substrate B1 and the cap substrate C1 are prepared in accordance with the above-mentioned processes, both substrates are placed in a vacuum chamber. Using inert gas such as argon, sputter etching or ion beam etching is slightly applied to the bonding surfaces of both substrates. The cap substrate C1 has its bonding surface corresponding to the sides S1 and S4 where the recess 32 is formed. The base substrate B1 has its bonding surface where the mechanical quantity sensor element is formed. This process eliminates a natural oxide film formed on the surfaces or adsorbed water, organic molecule (contaminant), etc. As a result, Si atoms having bonds are exposed on each silicon surface. The surface becomes active to increase a bonding force with the other Si atoms. The process positions the silicon surfaces of the base substrate B1 and the cap substrate C1 as shown in FIG. 6A. Both surfaces are contacted at normal temperature while keeping the vacuum state. Silicon atoms on the surfaces are bonded to each other into a unity and can provide rigid bonding.

When the base substrate and the cap substrate are made of silicon (Si), it may be preferable to use not only the silicon fusion bonding but also gold-silicon (Au—Si) eutectic bonding. This technique can also rigidly bond the base substrate B1 and the cap substrate C1 on the bonding surface D1 while ensuring the conductivity. The technique can completely seal the spaces 23 and 32 formed by the specified area R1 of the base substrate B1 and the recess 32 of the cap substrate. The base substrate B1 and the cap substrate C1 may be bonded to each other using a conductive adhesive such as silver (Ag) paste. The conductive adhesive can be used for the other materials than silicon (Si) as is used for the base substrate and the cap substrate.

The base substrate B1 and the cap substrate C1are rigidly bonded to seal the spaces 23 and 32 formed by the specified area R1 of the base substrate B1 and the recess 32 of the cap substrate. In addition, the leading conductive regions Ce1 and Ce2 electrically connect with the corresponding base semiconductor regions Bs1 and Bs2. The electrode pad 34 formed on the surface of the cap substrate C1 can be used to externally transmit an output from the mechanical quantity sensor element formed on the base substrate B1.

The processes in FIGS. 2A to 6B can manufacture the semiconductor device 100 in FIG. 1. In order to describe the manufacturing method of the semiconductor device 100 in FIG. 1, the description about FIGS. 2A to 6B deals with the method of manufacturing the region around the specified area R1 of the base substrate B1 where the mechanical quantity sensor element is formed. Different elements or circuits may be formed in another region of the base substrate B1. Actually, the base substrate B1 as a single wafer is processed to form several hundreds of chips each of which contains the semiconductor device 100.

The following describes several examples of the semiconductor device according to the present embodiment according to different constructions.

Figure 7A:
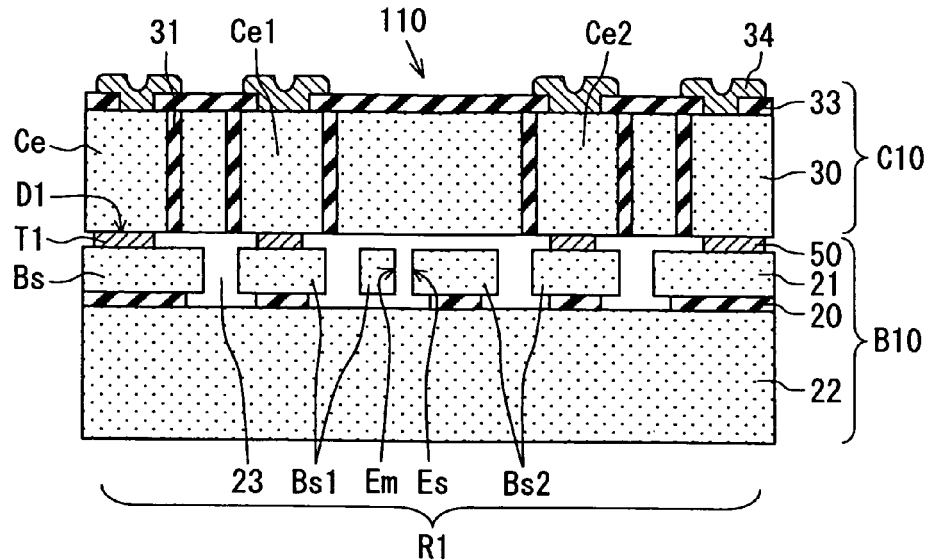
FIGS. 7A and 7B exemplify the semiconductor device according to another construction, in which FIG. 7A schematically shows a cross sectional view of a semiconductor device 110 and FIG. 7B schematically shows a top view thereof.
Figure 7B:
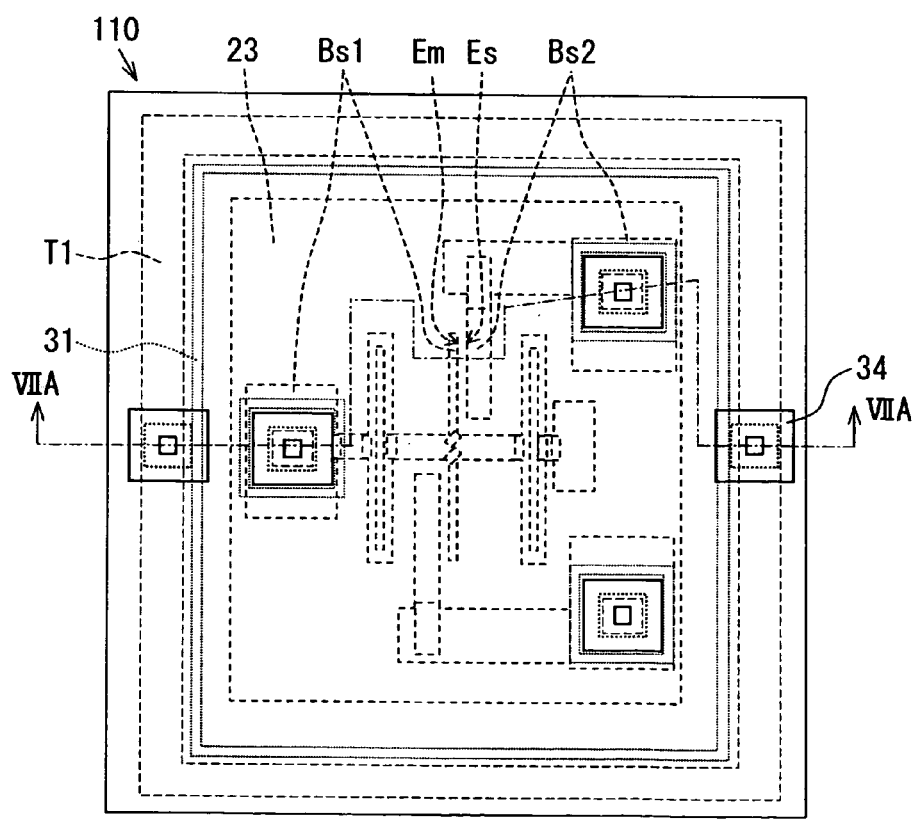

FIGS. 7A and 7B exemplify the semiconductor device according to another construction. FIG. 7A schematically shows a cross sectional view of a semiconductor device 110.

FIG. 7B schematically shows a top view thereof. The cross sectional view in FIG. 7A is taken in the line VIIA-VIIA of FIG. 7B and is appropriately scaled and simplified along the section line for ease of explanation. The mutually corresponding parts of the semiconductor device 110 in FIGS. 7A and 7B and the semiconductor device 100 in FIG. 1 are designated by the same reference numerals. FIG. 7B simplifies the movable electrode Em and the fixed electrode Es for the semiconductor device 110. Actually, both electrodes are alternated as shown in FIGS. 26A and 26B.

Figure 8A:
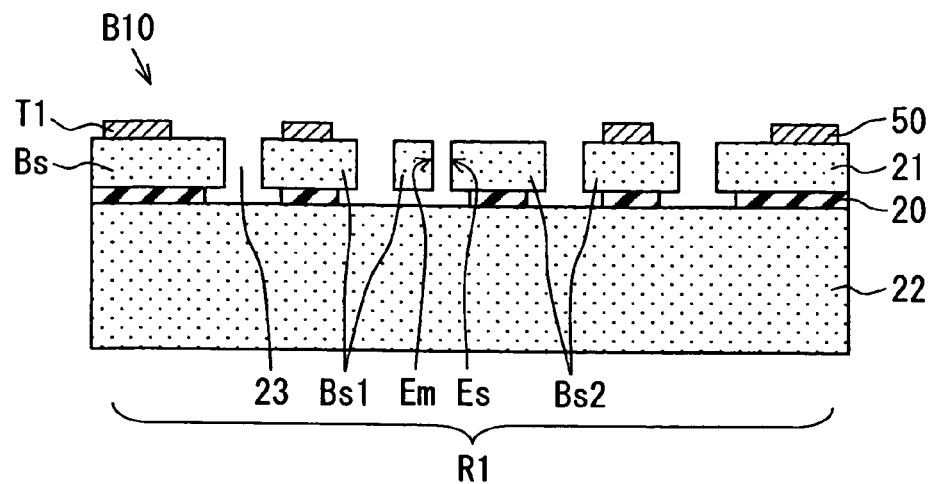
Figure 8B:
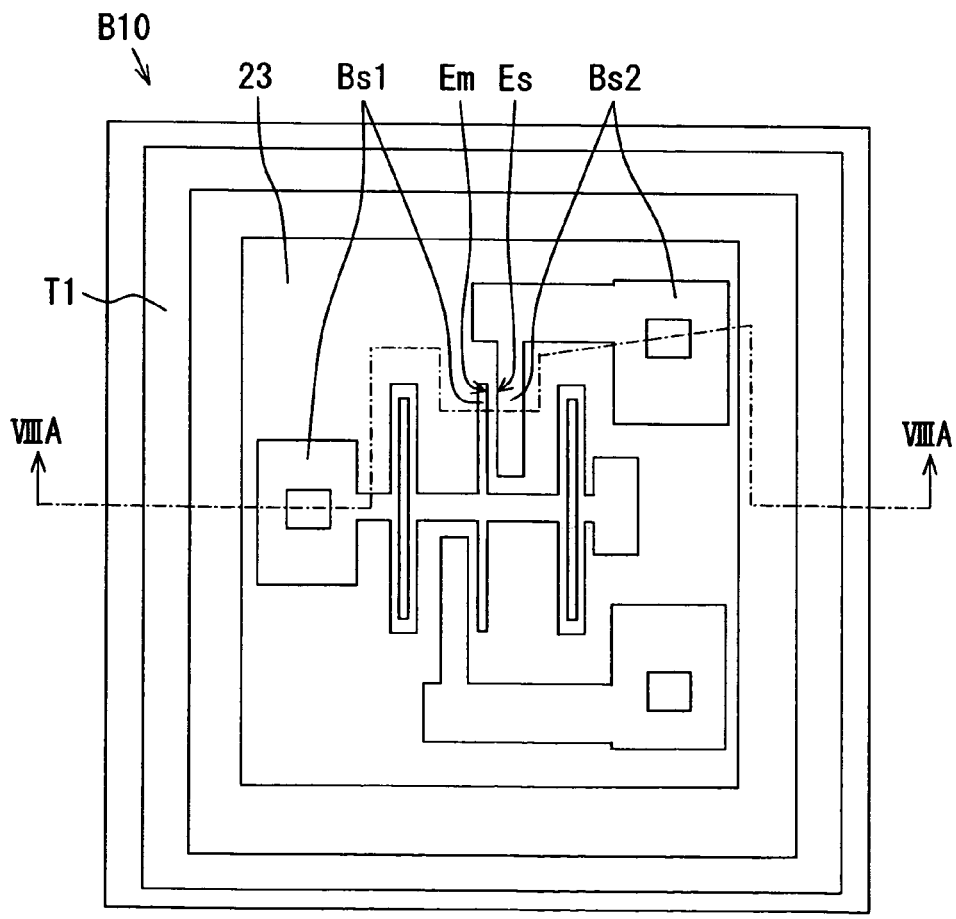
Figure 9A:
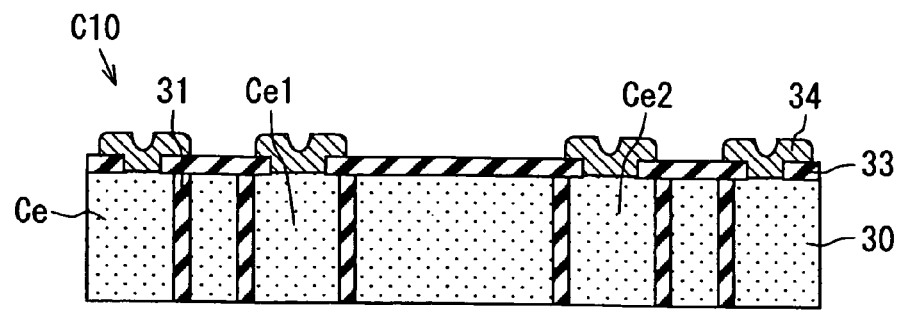
Figure 9B:
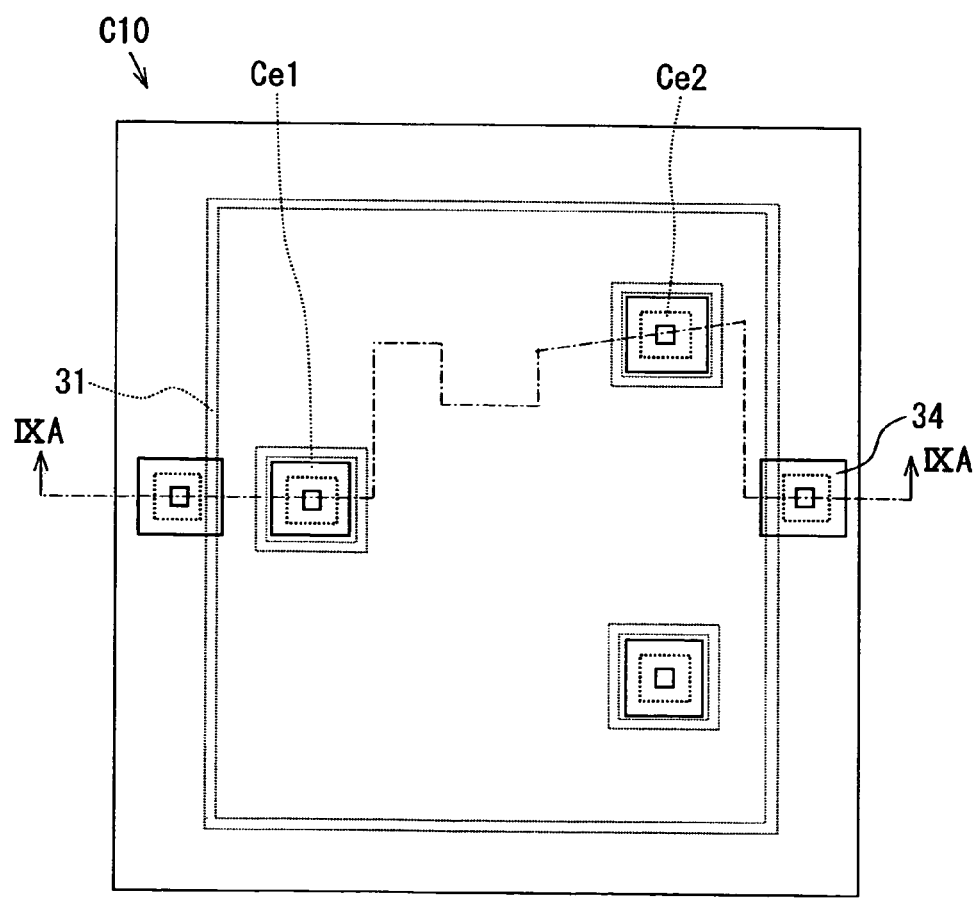

FIGS. 8A and 8B show a base substrate B10 of the semiconductor device 110 in FIGS. 7A and 7B. FIG. 8A is a cross sectional view of the base substrate B10. FIG. 8B is a top view thereof. FIGS. 9A and 9B show a cap substrate C10 of the semiconductor device 110 in FIGS. 7A and 7B. FIG. 9A is a cross sectional view of the cap substrate C10. FIG. 9B is a top view of the cap substrate C10. In FIGS. 7A to 9B, the cross sectional views designated by FIGS. 7A, 8A and 9A and the top views designated by FIGS. 7B, 8B and 9B correspond to each other. The section lines indicated by the dot-dash lines VIIA-VIIA, VIIIA-VIIIA and IXA-IXA also correspond to each other.

On the semiconductor device 100 in FIG. 1, the recess 32 is formed on the cap substrate C1 opposite to the specified area R1 of the surface layer for the base substrate B1. The cap substrate C1 is bonded to the base substrate B1 around the recess 32 to form the bonding surface D1.

On the other hand, the semiconductor device 110 in FIGS. 7A and 7B includes a projection T1 formed on the base semiconductor region Bs in the specified area R1 of the base substrate B10. The projection T1 includes a polycrystalline silicon or metal conductive film 50. The cap substrate C10 is bonded to the projection T1 of the base substrate B10 to form the bonding surface D1.

The cap substrate C10 functions as a sealing cap on the semiconductor device 110 in FIGS. 7A and 7B as well as the semiconductor device 100 in FIG. 1. The cap substrate C10 is conductive and is bonded to the base substrate B10. The cap substrate C10 protects the mechanical quantity sensor element formed on the specified area R1 of the surface layer for the base substrate B10. The cap conductive regions Ce1 and Ce2 are formed on the cap substrate C10 and are electrically connected to the base semiconductor regions Bs1 and Bs2 formed on the base substrate B10. The cap conductive regions Ce1 and Ce2 function as leading conductive regions so as to electrically connect a wire bonding etc. to the electrode pad 34 provided for the cap conductive region. The face down bonding (ball bonding) may be used to decrease mounting restrictions. The cap substrate C10 is available in any thickness. The cap substrate C10 can ensure high strength and can be manufactured inexpensively. Differently from the cap substrate C1 of the semiconductor device 100 in FIG. 1, the cap substrate C10 of the semiconductor device 110 in FIGS. 7A and 7B can flatten a surface to be bonded to the base substrate B10. The cap substrate C10 can be manufactured more easily than the cap substrate C1 as will be described below.

Similarly to the semiconductor device 100 in FIG. 1, the semiconductor device 110 in FIGS. 7A and 7B protects the mechanical quantity sensor element formed on the surface layer of the semiconductor base substrate B10. The semiconductor device 110 includes the sealing cap (substrate) C10 provided on the mechanical quantity sensor element of the base substrate B10. The semiconductor device 110 can be inexpensively manufactured to be small-sized and is capable of face down bonding to reduce mounting restrictions.

FIGS. 10A to 12B are cross sectional views exemplifying the manufacturing method for the semiconductor device 110 corresponding to processes.

FIGS. 10A to 10D show processes of preparing the base substrate, i.e., the base substrate B10 before being bonded to the cap substrate C10 of the semiconductor device 110 in FIGS. 7A and 7B.

Figure 10A:
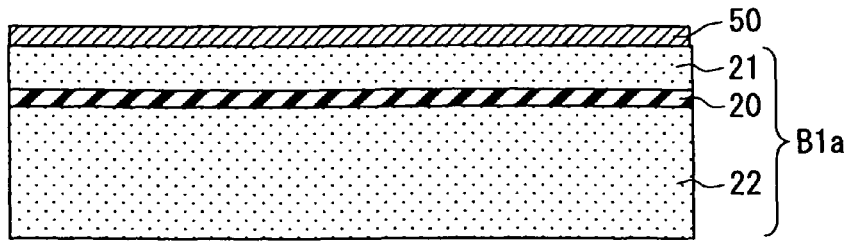
Figure 10B:
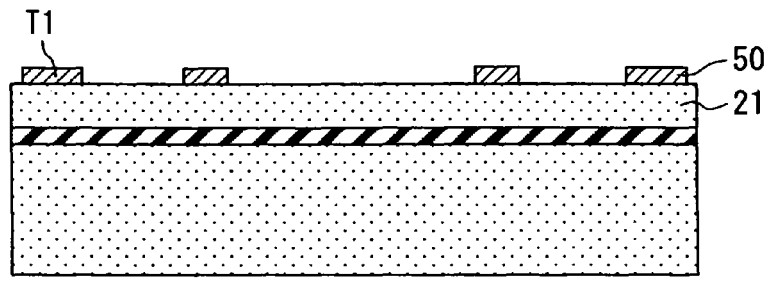
Figure 10C:
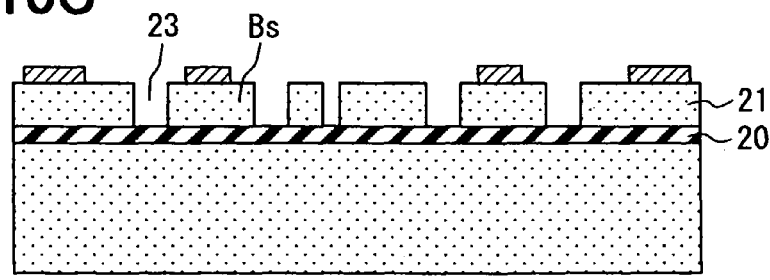
Figure 10D:
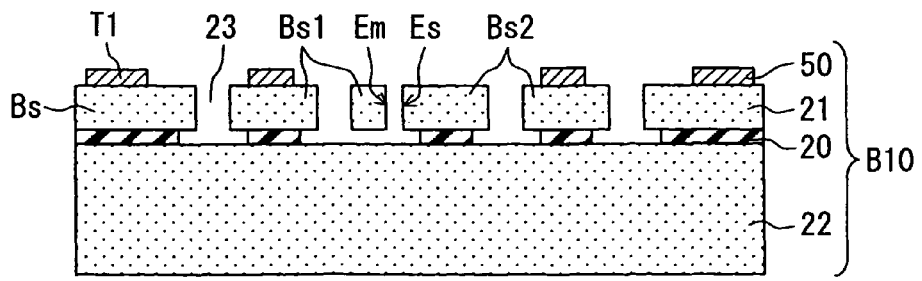

As shown in FIG. 10A, the SOI substrate B1a is prepared similarly to FIG. 2A. The polycrystalline silicon or metal conductive film 50 is deposited on the SOI substrate B1a. For example, the CVD technique is used to form the N+ conductive polycrystalline silicon conductive film 50 as thick as one to 10 μm on the N+ conductive single-crystal silicon SOI layer 21. In this example, the thickness is 2 μm. As shown in FIG. 10B, the general photolithography is used to pattern the conductive film 50 to partially form the projection T1 at a given position on the SOI layer 21. It may be also preferable to form an aluminum layer approximately 2 μm thick instead of the N+ conductive polycrystalline silicon layer. Similarly, the photolithography may be used to pattern the conductive film and form the aluminum projection T1. As shown in FIG. 10C similarly to FIG. 2C, the process forms the trench 23 reaching the embedded oxide film 20 to divide the SOI layer 21 and form multiple base semiconductor regions Bs insulated and separated from adjacencies. As shown in FIG. 10D similarly to FIG. 2C, the process forms the movable semiconductor region Bs1 having the movable electrode Em, the fixed semiconductor region Bs2 having the fixed electrode Es, etc.

The process in FIGS. 10A to 10D can prepare the base substrate B10 before being bonded to the cap substrate C10 described below.

Figure 11A:
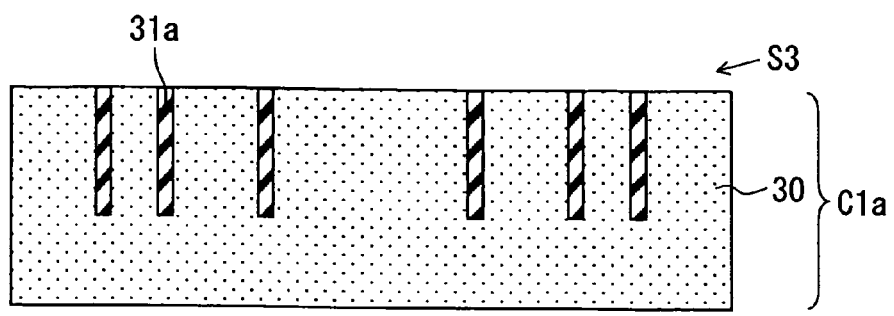
Figure 11B:
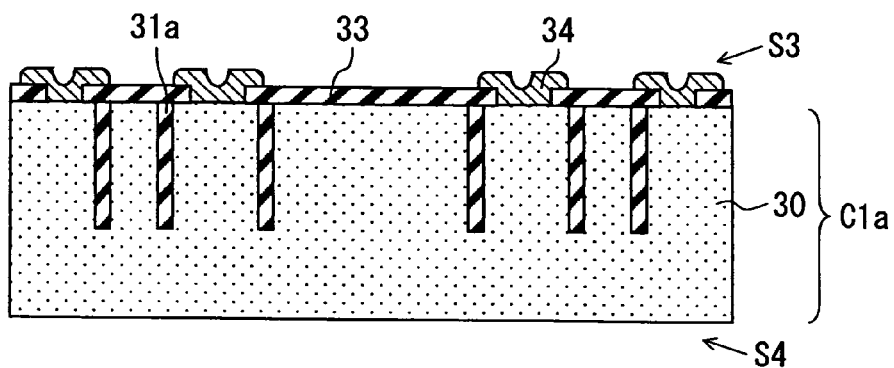
Figure 11C:
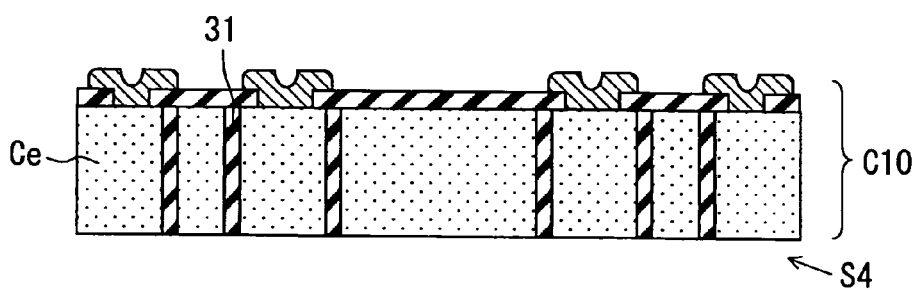

FIGS. 11A to 11C exemplify processes of preparing the cap substrate, i.e., the cap substrate C10 before being bonded to the base substrate B10 of the semiconductor device 110 in FIGS. 7A and 7B.

The processes in FIGS. 11A to 11C are similar to those in FIGS. 5A to 5C and a detailed description is omitted for simplicity. After the trench is formed as shown in FIG. 11A, the process embeds SiO₂ etc. as an insulator in the trench to form the primary insulating trench 31a. As shown in FIG. 11B, the process forms the SiO₂ film 33, the aluminum electrode pad 34, and the wiring layer (not shown). As shown in FIG. 11C, for example, CMP is used to grind the primary substrate C1a from the surface S4 for planarization. The process for forming the recess 32 in FIG. 5D can be omitted when forming the cap substrate C10 having a flat bonding surface. The processes in FIGS. 11A to 11C can prepare the cap substrate C10 having the surface S4 as a bonding surface before being bonded to the base substrate B10.

Figure 12A:
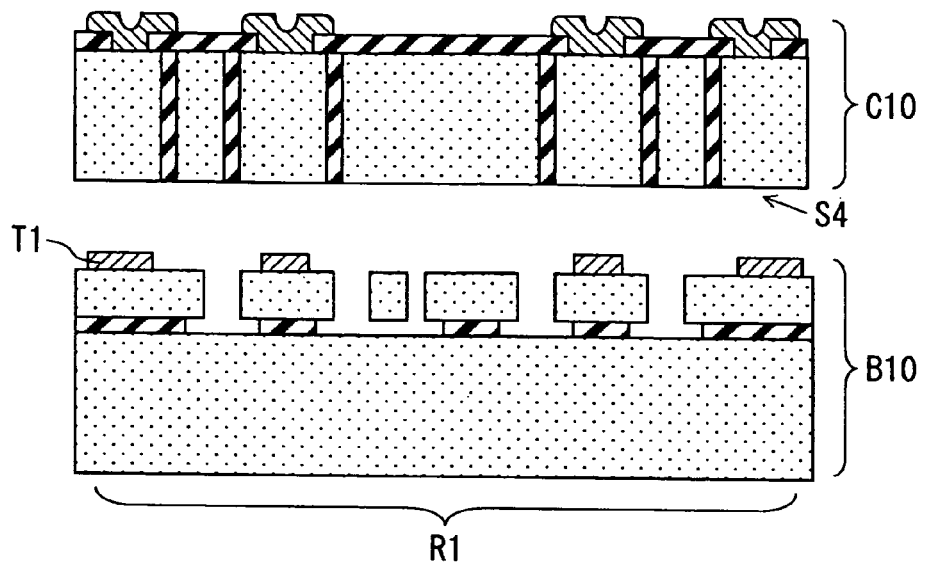
Figure 12B:
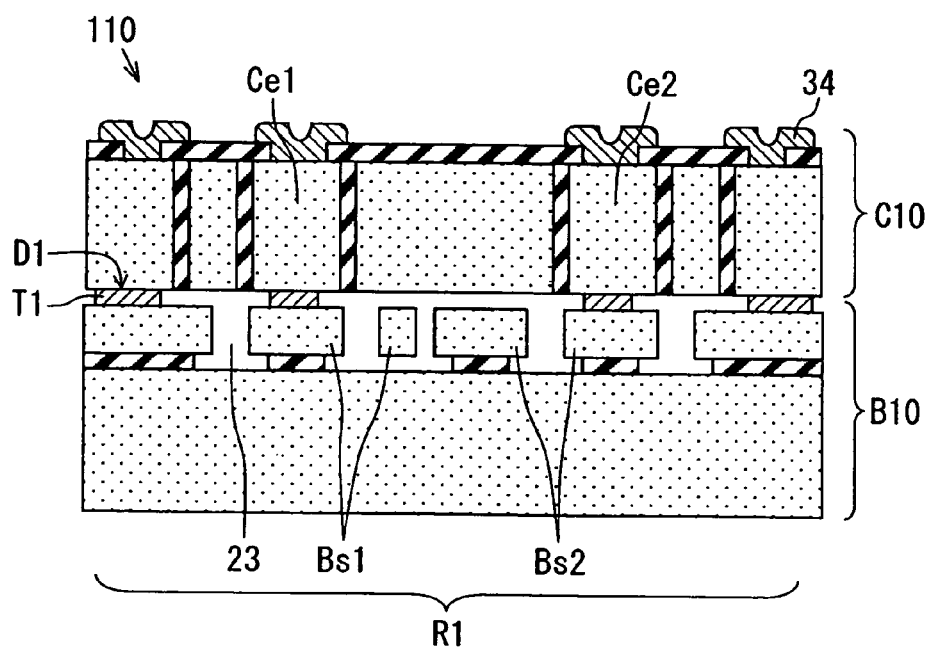

A substrate bonding process in FIGS. 12A and 12B bonds the base substrate B10 to the cap substrate C10 prepared in the preceding processes.

As shown in FIG. 12A, the cap substrate C10 and the base substrate B10 are layered. As shown in FIG. 12B, the cap substrate C10 is bonded to the projection T1 of the base substrate B10. For example, fusion bonding can be used in a high vacuum to bond the substrates. The fusion bonding in a high vacuum can be used for bonding not only between silicon atoms but also between silicon and metal atoms or between metal atoms. Obviously, a conductive adhesive can be used for bonding. The bonding process can tightly bond the base substrate B10 and the cap substrate C10 by ensuring the conductivity on the bonding surface D1. The bonding process can also completely seal the spaces 23 and 32 formed by the surface of the specified area R1 on the base substrate B10 and the cap substrate C10. The leading conductive regions Ce1 and Ce2 electrically connect with the corresponding base semiconductor regions Bs1 and Bs2. The electrode pad 34 formed on the surface of the cap substrate C10 can be used to externally transmit an output from the mechanical quantity sensor element formed on the base substrate B10.

Figure 13:
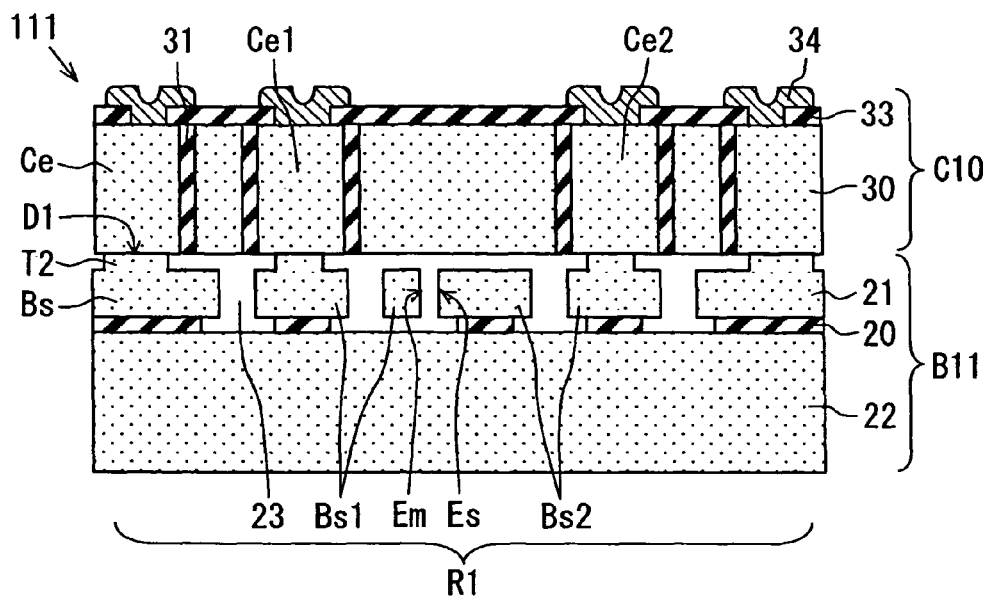
FIG. 13 exemplifies the semiconductor device according to still another construction and schematically shows a cross sectional view of a semiconductor device 111.

FIG. 13 exemplifies the semiconductor device according to still another construction and schematically shows a cross sectional view of a semiconductor device 111. The mutually corresponding parts of the semiconductor device 111 in FIG. 13 and the semiconductor device 110 in FIGS. 7A and 7B are designated by the same reference numerals.

As mentioned above, the semiconductor device 110 in FIGS. 7A and 7B includes the projection T1 formed on the base semiconductor region Bs in the specified area R1 of the base substrate B10. The projection T1 includes the polycrystalline silicon or metal conductive film 50. The cap substrate C10 is bonded to the projection T1 of the base substrate B10 to form the bonding surface D1.

The semiconductor device 111 in FIG. 13 includes a base substrate B11 that is processed to form the single-crystal silicon SOI layer 21. A projection T2 is formed on the base semiconductor region Bs in the specified area R1. The cap substrate C10 has the same flat bonding surface as that for the semiconductor device 110 and is bonded to the projection T2 of the base substrate B11 to form the bonding surface D1.

Similarly to the semiconductor device 110 in FIGS. 7A and 7B, the semiconductor device 111 in FIG. 13 protects the mechanical quantity sensor element formed on the surface layer of the semiconductor base substrate B11. The semiconductor device 111 includes the sealing cap (substrate) C10 provided on the mechanical quantity sensor element of the base substrate B11. The semiconductor device 111 can be inexpensively manufactured to be small-sized and is capable of face down bonding to reduce mounting restrictions.

Figure 14:
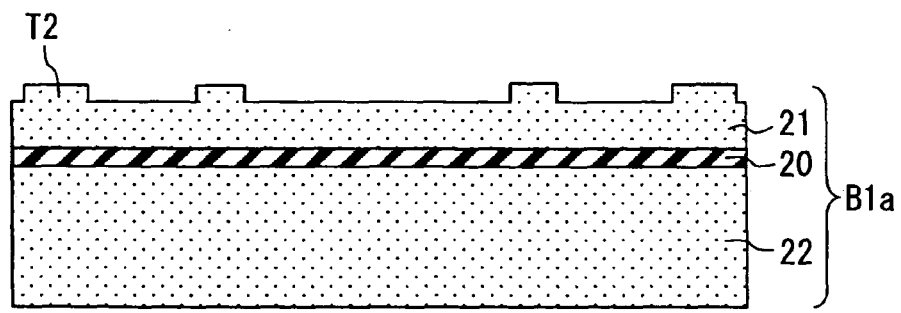
FIG. 14 shows a method of manufacturing the semiconductor device 111 and provides a cross sectional view of the base substrate B11 before being bonded to the cap substrate C10.

FIG. 14 shows a method of manufacturing the semiconductor device 111 and provides a cross sectional view of the base substrate B11 before being bonded to the cap substrate C10.

Similarly to FIG. 2A, the SOI substrate B1a is used as the base substrate B11. As shown in FIG. 14, the process first performs plasma etching or wet etching using KOH etc. to pattern the surface layer of the SOI layer 21 and form the projection T2. Subsequently, the base substrate B11 can be prepared in the same manner as shown FIGS. 10C and 10D. The processes in FIGS. 11A to 11C prepare the cap substrate C10. Similarly to FIGS. 12A and 12B, the processes can bond the base substrate B11 and the cap substrate C10 to manufacture the semiconductor device 111.

Figure 15:
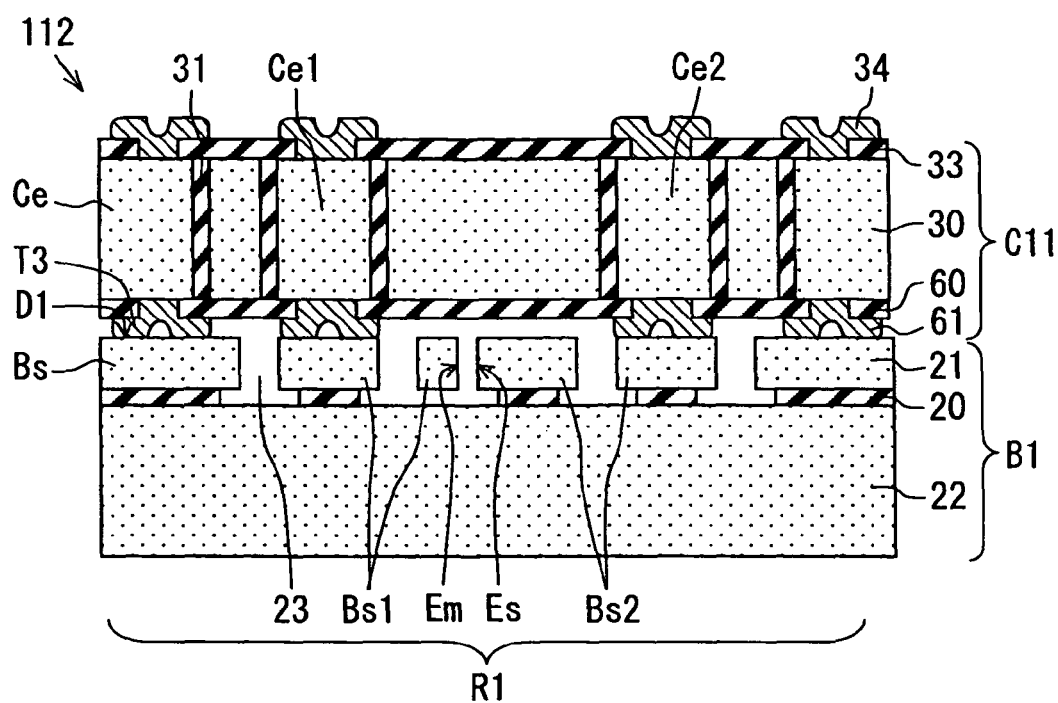
FIG. 15 exemplifies the semiconductor device according to yet another construction and schematically shows a cross sectional view of a semiconductor device 112.
Figure 16A:
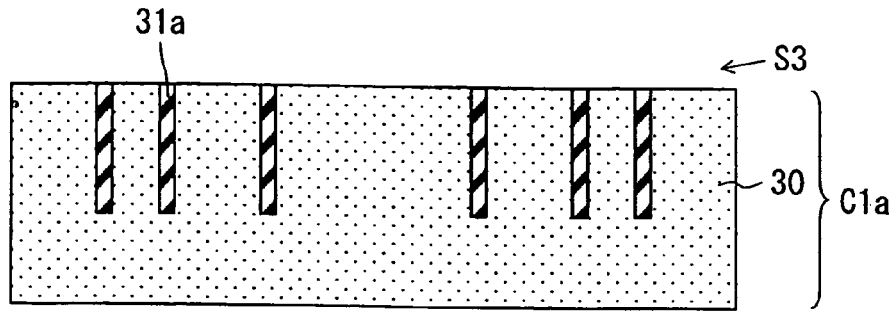
Figure 16B:
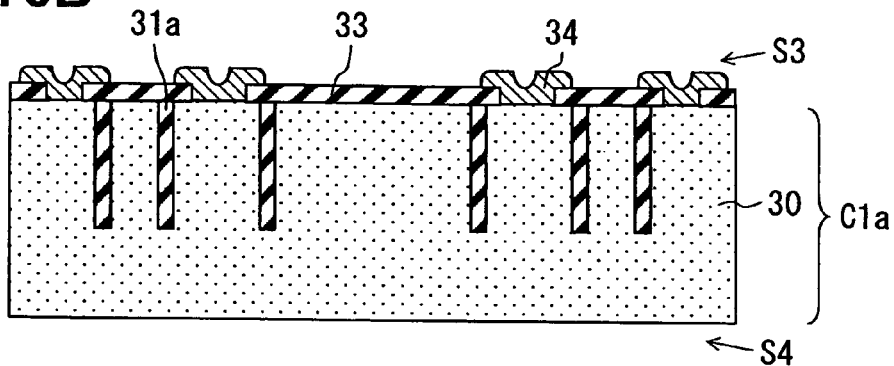
Figure 16C:
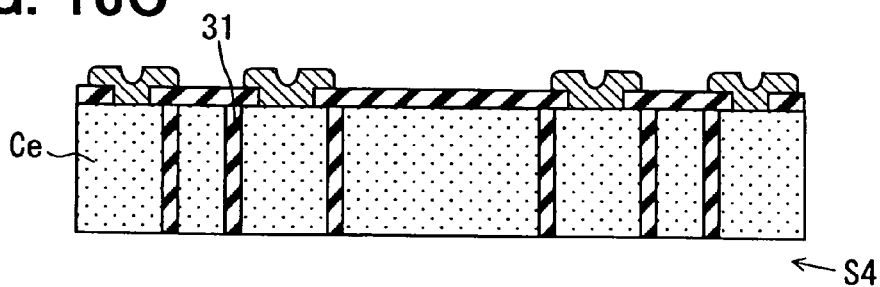
Figure 16D:
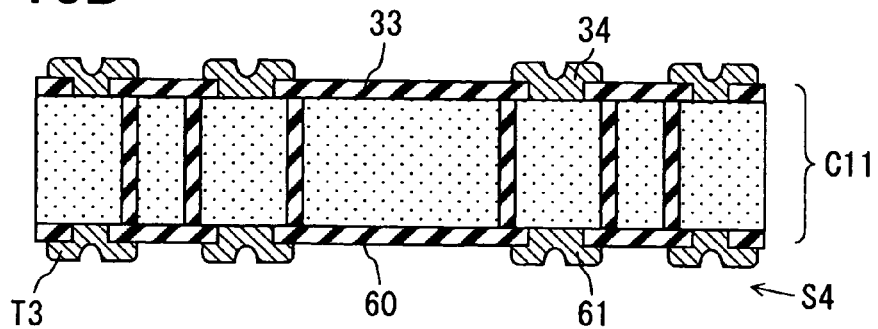

FIG. 15 exemplifies the semiconductor device according to yet another construction and schematically shows a cross sectional view of a semiconductor device 112. The mutually corresponding parts of the semiconductor device 112 in FIG. 15 and the semiconductor device 100 in FIG. 1 are designated by the same reference numerals.

On the semiconductor device 100 in FIG. 1, the recess 32 is formed on the cap substrate C1 opposite to the specified area R1 of the surface layer for the base substrate B1. The cap substrate C1 is bonded to the base substrate B1 around the recess 32 to form the bonding surface D1.

The semiconductor device 112 in FIG. 15 includes a conductive projection T3 formed on the cap substrate C11 opposite to the specified area R1 of the base substrate B1. Similarly to electrode pad 34, the projection T3 of the cap substrate C11 is made of an aluminum (Al) or polycrystalline silicon conductive film 61 and is connected to a cap conductive region Ce via an insulating film 60. In other words, the cap substrate C11 of the semiconductor device 112 in FIG. 15 is provided with the wiring patterns 34 and 61 on both surfaces of the single-crystal silicon substrate 30 via the insulating films 33 and 60. The semiconductor device 112 includes the cap substrate C11 bonded to the base substrate B1 at the projection T3 to form the bonding surface D1. The bonding process can be also chosen from the fusion bonding by heating in vacuum and the conductive adhesive as mentioned above.

Similarly to the semiconductor device 100 in FIG. 1, the semiconductor device 112 in FIG. 15 protects the mechanical quantity sensor element formed on the surface layer of the semiconductor base substrate B1. The semiconductor device 112 includes the sealing cap (substrate) C11 provided on the mechanical quantity sensor element of the base substrate B1. The semiconductor device 112 can be inexpensively manufactured to be small-sized and is capable of face down bonding to reduce mounting restrictions.

Figure 17A:
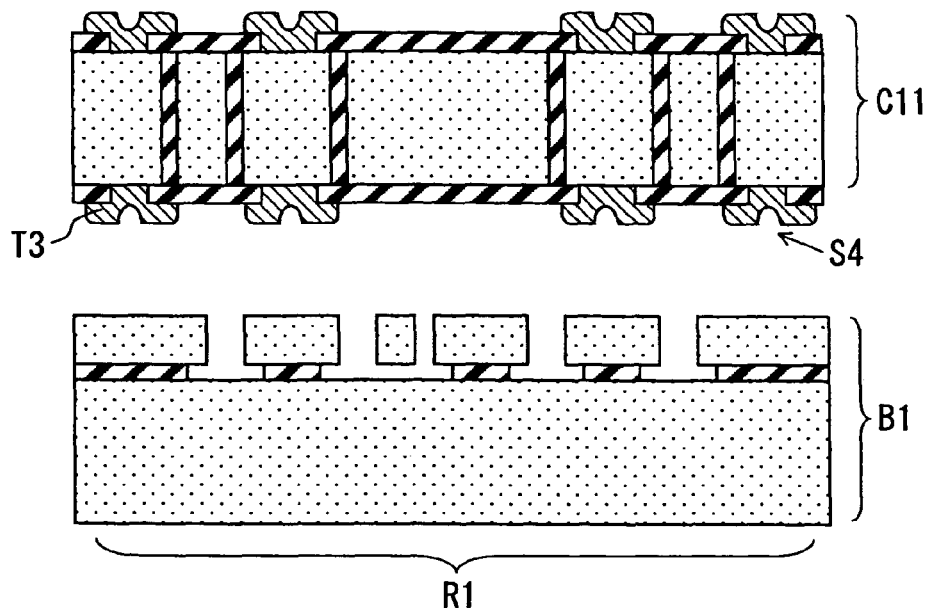
Figure 17B:
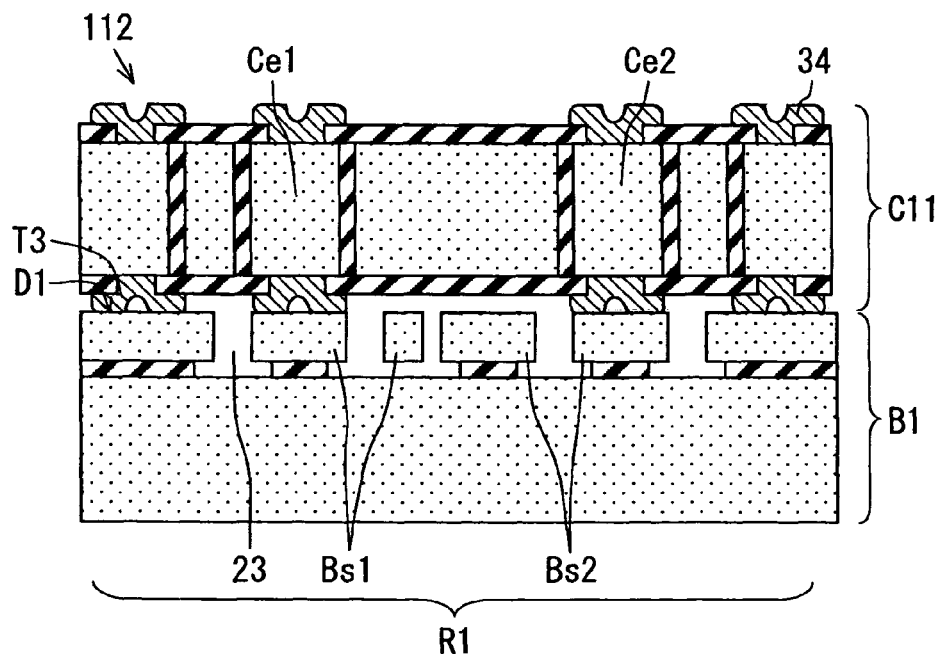

FIGS. 16 and 17 show a method of manufacturing the semiconductor device 112. FIGS. 16A to 16D are cross sectional views showing processes of preparing a cap substrate C11 before being bonded to the base substrate B1. FIGS. 17A and 17B show processes of bonding the base substrate B1 to the cap substrate C11. The processes in FIGS. 16A to 16C are equal to those in FIGS. 11A to 11C and a description is omitted for simplicity. As shown in FIG. 16D, the cap substrate C11 includes a wiring pattern 61 via an insulating film 60 on the surface S4. The wiring pattern 61 is used as the projection T3 for bonding.

As shown in FIG. 17A, the process layers the base substrate B1 prepared by the processes in FIGS. 2A to 2C and the cap substrate C11 prepared by the processes in FIGS. 17A to 17C. As shown in FIG. 17B, the process bonds the cap substrate C11 and the base substrate B1 at the projection T3 to form the bonding surface D1.

In this manner, the semiconductor device 112 has been manufactured.

Figure 18A:
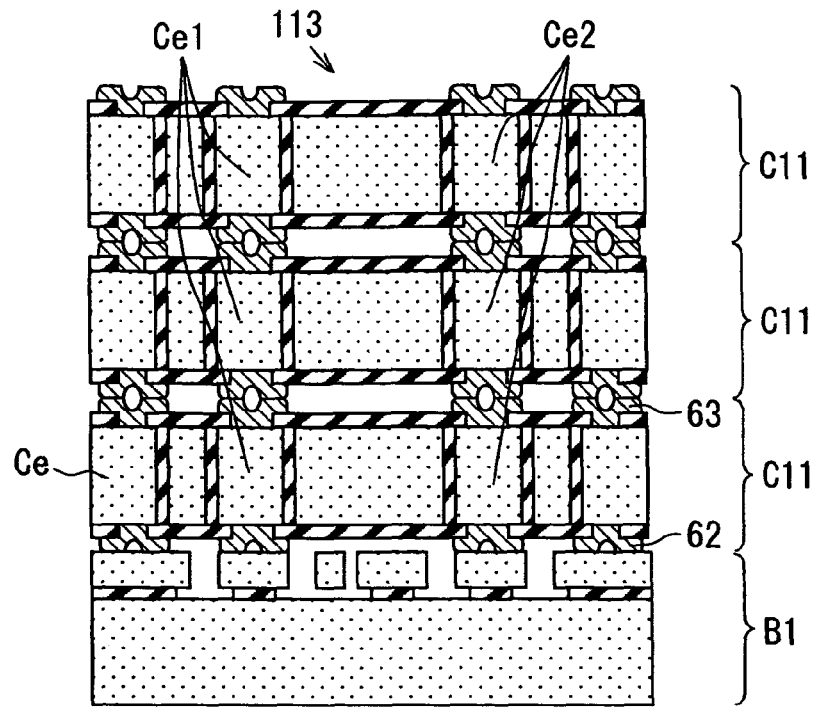
FIGS. 18A and 18B show modifications of the semiconductor device 112 and provide schematic cross sectional views of semiconductor devices 113 and 114.
Figure 18B:
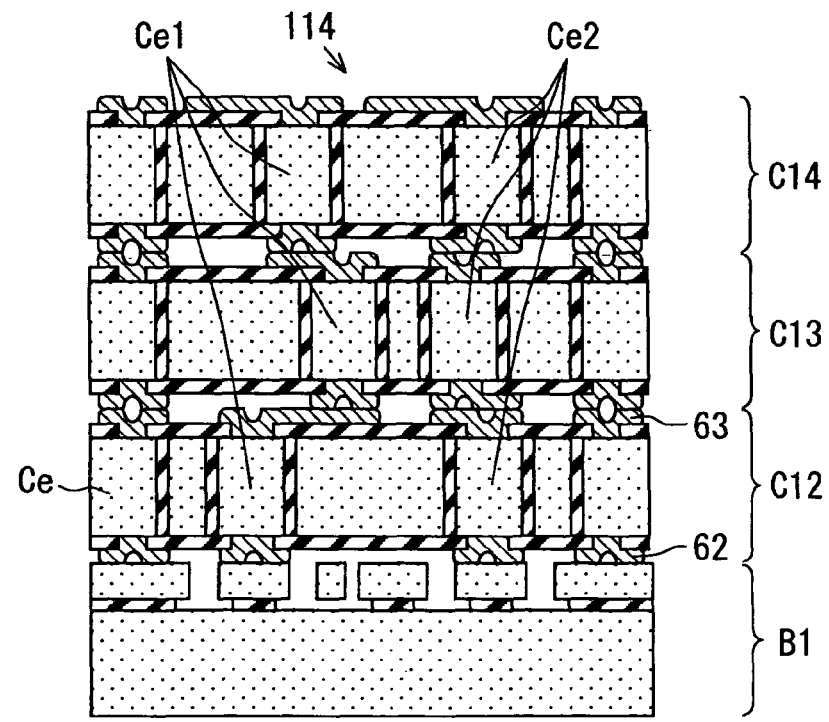

FIGS. 18A and 18B show modifications of the semiconductor device 112 in FIG. 15 and provide schematic cross sectional views of semiconductor devices 113 and 114.

The semiconductor devices 113 and 114 in FIGS. 18A and 18B each include wiring patterns 62 and 63 that are formed on both sides of each of layered cap substrates C11 to C14 and are bonded to the base substrate B1. The semiconductor device 113 in FIG. 18A includes three same layered cap substrates C11 bonded to the base substrate B1. The semiconductor device 114 in FIG. 18B includes three different layered cap substrates C12 to C14 bonded to the base substrate B1.

Since different cap substrates are layered in the semiconductor device 114 in FIG. 18B, the pad can be placed at any position of the leading conductive region exposed to the surface of the semiconductor device. Concerning the semiconductor devices 113 and 114 in FIGS. 18A and 18B, the layered cap substrates C11 to C14 include a cap conductive region Ce that is not used for the leading conductive regions Ce1 and Ce2. As will be described later, for example, an IC circuit can be formed for such cap conductive region Ce. The semiconductor device 113 or 114 can use the cap conductive region in another layered cap substrate as a leading conductive region from the cap conductive region where the IC circuit is formed. Circuits can be cubicly constructed in the semiconductor device 113 or 114 including the base substrate B1 bonded to the cap substrates C11 to C14.

The following describes an example of the semiconductor device including the other elements than the mechanical quantity sensor element.

Figure 19:
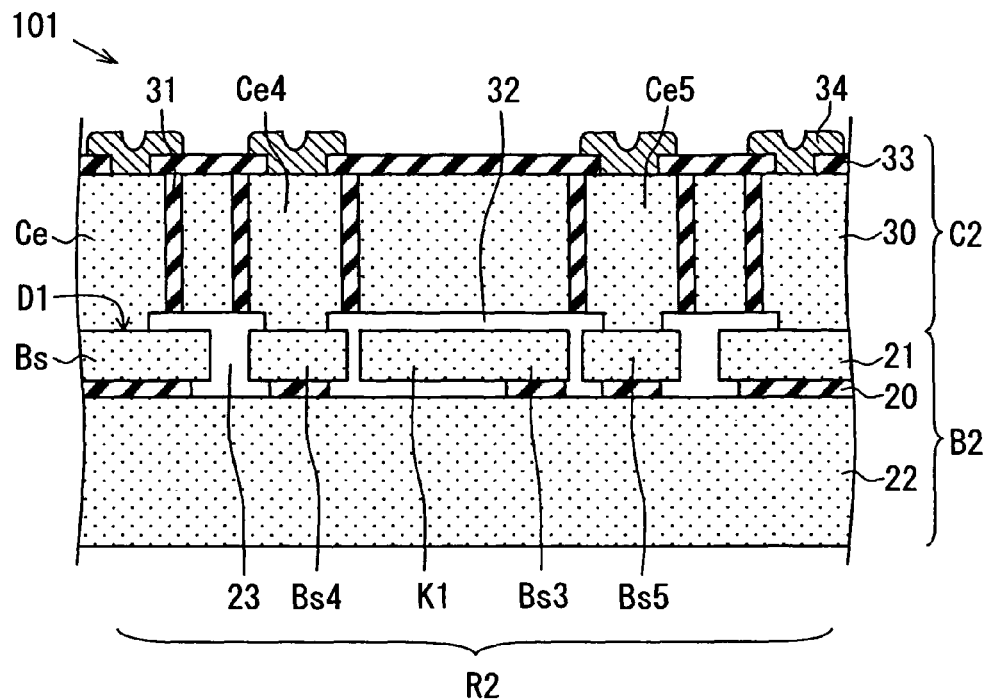
FIG. 19 is a schematic cross sectional view of a semiconductor device 101 having an MEMS resonator.

FIG. 19 is a schematic cross sectional view of a semiconductor device 101 having an MEMS (Micro Electro Mechanical System) resonator. The semiconductor device 101 in FIG. 19 is structured similarly to the semiconductor device 100 in FIG. 1. The mutually corresponding parts of the semiconductor device 101 in FIG. 19 and the semiconductor device 100 in FIG. 1 are designated by the same reference numerals and a description is omitted for simplicity.

As shown in FIG. 19, the semiconductor device 101 having the MEMS resonator uses an SOI substrate as the base substrate B2 that includes the embedded oxide film 20 sandwiched between the SOI layer 21 and the support substrate 22. The MEMS resonator is formed on the SOI layer 21 of the base substrate B2. The base substrate B2 includes multiple base semiconductor regions Bs. Of these, at least one base semiconductor region, a base semiconductor region Bs3 in this example, has a displaceably formed resonator K1 by applying sacrifice layer etching to part of the embedded oxide film 20. The semiconductor device 101 includes the recess 32 for the cap substrate C2 so as to cover the resonator K1. The semiconductor device 101 supplies power to a piezoelectric element (not shown) etc. connected to the resonator K1 using leading conductive regions Ce4 and Ce5 of the cap substrate C2 connected to base semiconductor regions Bs4 and Bs5. Resonating the resonator K1 oscillates a voltage at a specified frequency. It may be preferable to use another type of MEMS resonator that resonates due to capacitive coupling between a movable electrode and a fixed electrode.

The semiconductor device 101 having the MEMS resonator in FIG. 19 also includes the sealing cap (substrate) C2 over the MEMS resonator of the base substrate B2 so as to cover the MEMS resonator formed on the surface layer in the specified area R2 of the semiconductor base substrate B2. The semiconductor device 101 can be inexpensively manufactured to be small-sized and is capable of face down bonding to reduce mounting restrictions. The semiconductor device 101 having the MEMS resonator in FIG. 19 is more capable of miniaturization and cost reduction than a semiconductor device having a general quartz resonator.

Figure 20A:
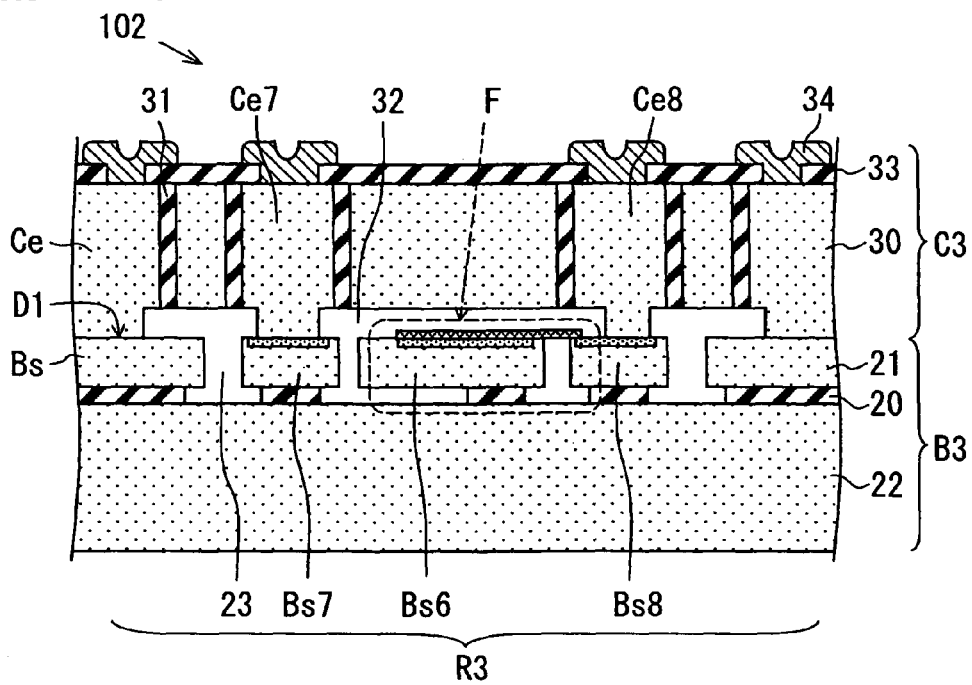
Figure 20B:
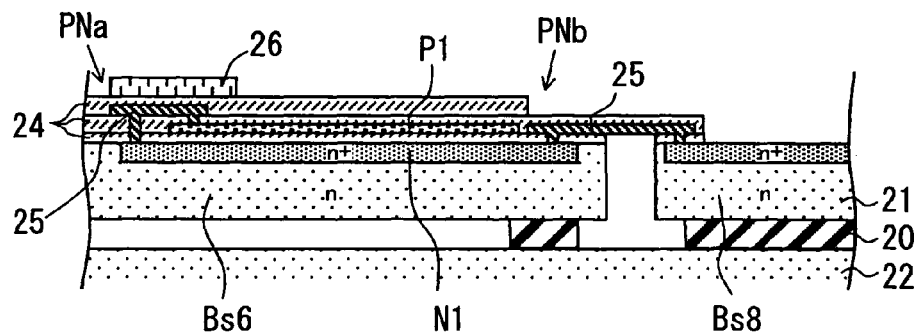
Figure 20C:
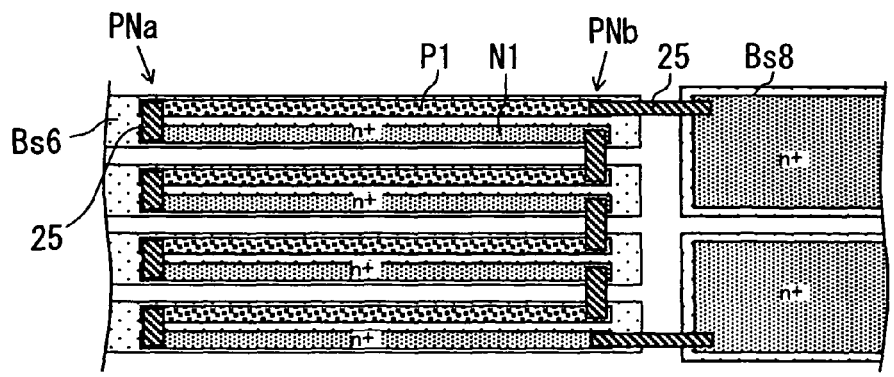

FIGS. 20A to 20C exemplify the semiconductor device having an infrared sensor element. FIG. 20A is a schematic cross sectional view of a semiconductor device 102. FIG. 20B is an enlarged view around the infrared sensor element enclosed by a broken line F in FIG. 20A. FIG. 20C is a schematic top view showing a partial layout of FIG. 20B. The semiconductor device 102 in FIGS. 20A to 20C is structured similarly to the semiconductor device 100 in FIG. 1. The mutually corresponding parts of the semiconductor device 102 in FIGS. 20A to 20C and the semiconductor device 100 in FIG. 1 are designated by the same reference numerals.

As shown in FIG. 20A, the semiconductor device 102 having the infrared sensor element uses an SOI substrate as a base substrate B3 that includes the embedded oxide film 20 sandwiched between the SOI layer 21 and the support substrate 22. The infrared sensor element enclosed in the broken line XX is formed on the SOI layer 21 of the base substrate B3. As shown in FIGS. 20B and 20C, the infrared sensor element includes a thermocouple and an Au-black (gold-black) infrared absorber film 26. The thermocouple includes pairs of n-conductive (n+) regions N1 formed on the base semiconductor region Bs6 and polycrystalline silicon films P1 connected to each other through a silicon oxide ($SiO_2$) inter-layer insulating film 24 and an aluminum (Al) wiring metal 25. As shown in FIGS. 20B and 20C, the infrared absorber film 26 is formed at a hot junction of the thermocouple. The thermocouple's hot junction and the infrared absorber film 26 are placed on part of the base semiconductor region Bs6 where the embedded oxide film 20 is removed and the heat due to infrared adsorption is retained. The thermocouple's cold junction is placed on part of the base semiconductor region Bs6 where the embedded oxide film 20 remains and the heat due to infrared adsorption is transferred easily. As shown in FIG. 20A, the semiconductor device 102 includes the cap substrate C3 where the recess 32 is formed to cover the infrared sensor element formed in the specified area R3 of the base substrate B3. Base semiconductor regions Bs7 and Bs8 connect with leading conductive regions Ce7 and Ce8 of the cap substrate C2. The leading conductive regions Ce7, Ce8, etc. are used to detect an output voltage from the infrared sensor element generated by infrared rays applied to the infrared absorber film 26.

The semiconductor device having the infrared sensor element also includes the sealing cap provided on the infrared sensor element of the base substrate so as to protect the infrared sensor element formed on the surface layer of the semiconductor base substrate. As mentioned above, the semiconductor device can be inexpensively manufactured to be small-sized and is capable of face down bonding to reduce mounting restrictions.

Figure 21:
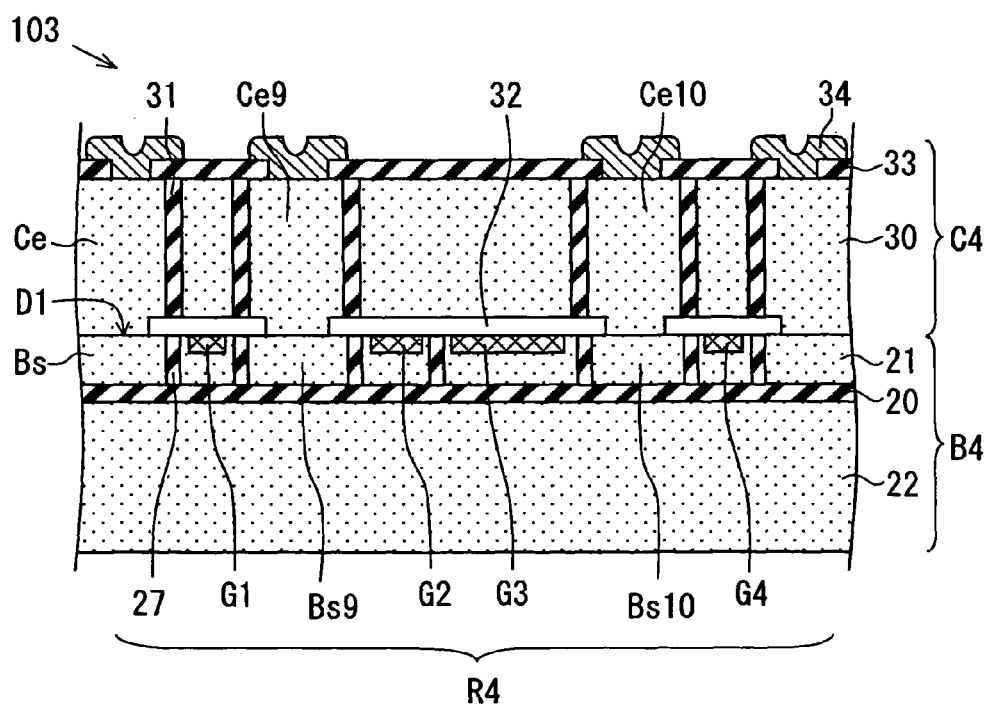
FIG. 21 is a schematic cross sectional view of a semiconductor device 103 according to still yet another construction.

FIG. 21 is a schematic cross sectional view of a semiconductor device 103 according to still yet another construction.

The semiconductor device 103 in FIG. 21 includes IC (Integrated Circuit) circuits G1 to G4 formed in a specified area R4 of a base substrate B4. Similarly to the semiconductor devices 100 to 102, the semiconductor device 103 in FIG. 21 also uses the base substrate B4 as an SOI substrate including the embedded oxide film 20 sandwiched between the SOI layer 21 and the support substrate 22. The semiconductor devices 100 to 102 include the SOI layer 21 corresponding to the base substrates B1 to B3. The SOI layer 21 is divided by the trench 23 reaching the embedded oxide film 20 to form insulated and separated base semiconductor regions Bs. On the other hand, the SOI layer 21 of the base substrate B4 in FIG. 21 is divided by an insulating and separating trench 27 to form insulated and separated base semiconductor regions Bs. The insulating and separating trench 27 reaches the embedded oxide film 20 and is embedded with silicon oxide ($SiO_2$) etc.

Similarly to the semiconductor devices 100 to 102, the semiconductor device 103 in FIG. 21 includes a cap substrate C4 having the recess 32 opposite to the specified area R4 of the base substrate B4 where the IC circuits G1 to G4 are formed. The IC circuits G1 to G4 of the semiconductor device 103 are electrically connected to an external circuit through leading conductive regions Ce9 and Ce10 connected to base semiconductor regions Bs9 and Bs10.

Similarly to the semiconductor devices 100 to 102, the semiconductor device 103 in FIG. 21 for forming the IC circuits also includes the sealing cap (substrate) C4 over the IC circuits G1 to G4 formed on the surface layer of the semiconductor base substrate B4 so as to protect the IC circuits. The semiconductor device 103 can be inexpensively manufactured to be small-sized and is capable of face down bonding to reduce mounting restrictions. The cap substrate C4 contactlessly and hermetically protects the IC circuits G1 to G4 formed on the surface layer of the semiconductor base substrate B4. When the IC circuits G1 to G4 are prone to a stress or similar influence, the cap substrate C4 is more preferable than a protection film that may be formed on these circuits.

The semiconductor devices 100 to 103 use the SOI substrate having embedded oxide film 20 as the base substrates B1 to B4. The base semiconductor region Bs belongs to the SOI layer 21 and is insulated and separated from adjacencies by the trench 23 or the insulating and separating trench 27 reaching the embedded oxide film 20. However, the semiconductor base substrate of the semiconductor device according to the present embodiment can use not only the SOI substrate but also the single-crystal silicon substrate. In this case, for example, the PN-junction separation can be used to form the insulated and separated base semiconductor regions.

The following describes modifications of the cap substrates C1 to C4 used for the semiconductor devices 100 to 103.

Figure 22:
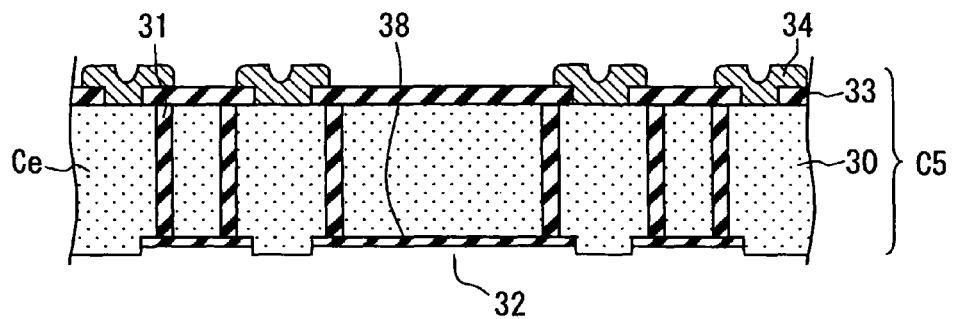
FIG. 22 is a schematic cross sectional view of a cap substrate C5 and illustrates a modification of the cap substrate.

FIG. 22 is a schematic cross sectional view of a cap substrate C5 and illustrates a modification of the cap substrate.

Differently from the cap substrates C1 to C4, the cap substrate C5 in FIG. 22 includes a silicon oxide ($SiO_2$) insulating film 38 at a specified portion (ceiling) of the recess 32 for the cap substrate C5. For example, the cap substrate C5 can replace the cap substrate C1 in FIG. 1. The specified area R1 of the semiconductor base substrate B1 and the recess 32 of the conductive cap substrate C5 form the spaces 23 and 32. The insulating film 38 formed for the specified portion of the recess 32 can prevent a failure such as short-circuiting due to water etc. remaining in the spaces 23 and 32. The insulating film 38 can use not only an $SiO_2$ film but also a silicon nitride ($Si_3N_4$) film, an aluminum oxide ($Al_2O_3$) film, etc.

Figure 23:
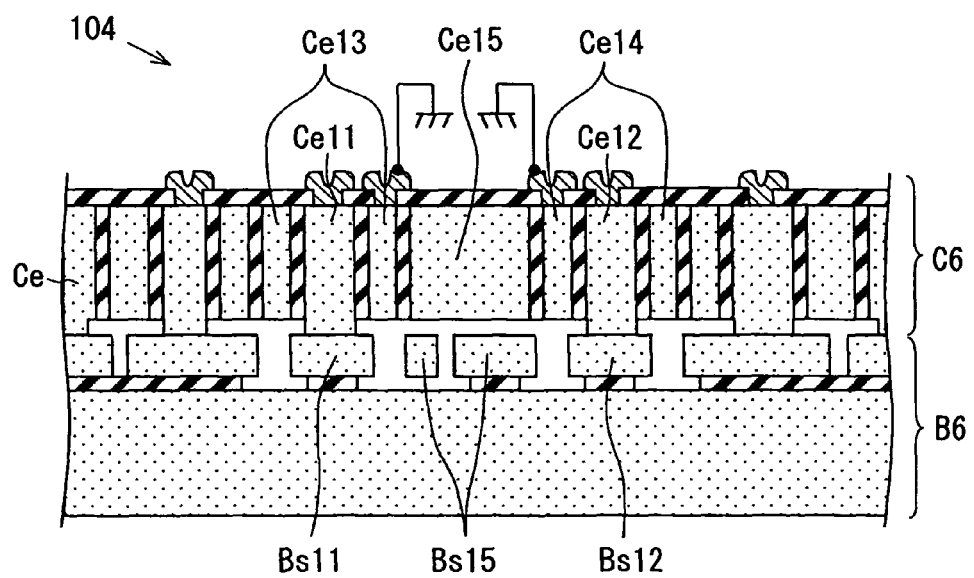
FIG. 23 is a schematic cross sectional view of a semiconductor device 104 using a cap substrate C6 and illustrates another modification of the cap substrate.

FIG. 23 is a schematic cross sectional view of a semiconductor device 104 using a cap substrate C6 and illustrates another modification of the cap substrate.

The semiconductor device 104 in FIG. 23 includes base semiconductor regions Bs11 and Bs12 of a base substrate B6 connected to cap conductive regions Ce11 and Ce12 of the cap substrate C6, respectively. Cap conductive regions Ce13 and Ce14 surround the cap conductive regions (leading conductive regions) Cell and Ce12 and are configured as ground potentials (GND). Accordingly, the cap conductive regions Ce13 and Ce14 can function as shields for the leading conductive regions Ce11 and Ce12. A cap conductive region Ce15 between the leading conductive regions Ce11 and Ce12 can be configured as a ground potential (GND) to completely shield the base semiconductor region Bs15 of the base substrate B6.

A given cap conductive region Ce of the cap substrate C6 may be configured as a given potential other than the ground potential (GND). For example, the semiconductor device 104 in FIG. 23 can supply a given potential for the cap conductive regions Ce13 and Ce14 around the leading conductive regions Ce11 and Ce12 to form a ring for applying potentials. Some of the cap conductive regions Ce can be supplied with an intermediate potential between the ground potential (GND) and a power supply potential. This makes it possible to decrease a potential difference between the adjacent cap conductive regions Ce and improve insulation and separation properties. Obviously, the cap conductive region Ce may be supplied with no potential and may be floating.

The single-crystal silicon substrate is used for the cap substrate C1 of the semiconductor device 100 in FIG. 1. The conductive cap substrate of the semiconductor device according to the present embodiment may be not only a single-crystal silicon substrate but also an SOI substrate, a polycrystalline silicon substrate, a compound semiconductor (GaAs, GaN, etc.), or a metal (Cu, Fe, W, Al, etc.) substrate.

Figure 24:
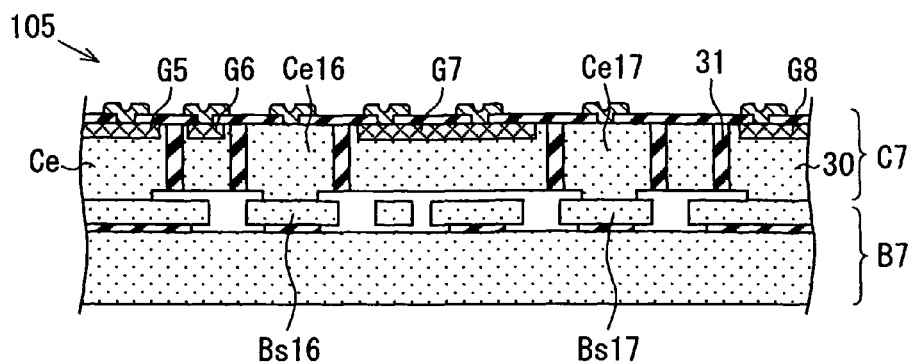
FIG. 24 is a schematic cross sectional view of a semiconductor device 105 using a cap substrate C7 and illustrates still another modification of the cap substrate.

FIG. 24 is a schematic cross sectional view of a semiconductor device 105 using a cap substrate C7 and illustrates still another modification of the cap substrate.

The semiconductor device 105 in FIG. 24 uses the single-crystal silicon substrate 30 as the cap substrate C7. Some cap conductive regions Ce of the cap substrates C7 form IC circuits G5 to G8. The IC circuits G5 to G8 may include any circuits such as a bipolar circuit and a CMOS circuit. For example, the single-crystal silicon substrate 30 for forming the IC circuits G5 to G8 is n-conductive and has the specific resistance of 1 to 20 Ωcm. In this case, the leading conductive regions Ce16 and Ce17 of the cap substrate C7 connect with the base semiconductor regions Bs16 and Bs17 of the base substrate B7 and are processed by phosphorus (P) or arsenic (As) ion implantation so as to become highly-concentrated n-conductive (n+). Let us suppose to form a major part of the mechanical quantity sensor element described for the semiconductor device 100 (FIG. 1) on the base substrate B7. The IC circuits G5 to G8 of the cap substrate C7 are used as peripheral circuits for processing outputs from the mechanical quantity sensor element. Since the IC circuits G5 to G8 are provided for the major part of the large-area mechanical quantity sensor element, the cap substrate C7 can be used efficiently and the semiconductor device 105 can be miniaturized as a whole. In this case, the IC circuits G5 to G8 may be formed before or after bonding the base substrate B7 and the cap substrate C7.

The cap substrate can be made of a single-crystal silicon substrate, an SOI substrate, or a compound semiconductor substrate. Various semiconductor elements and IC circuits can be formed on not only the base substrate but also some of the cap conductive regions on the cap substrate.

Figure 25A:
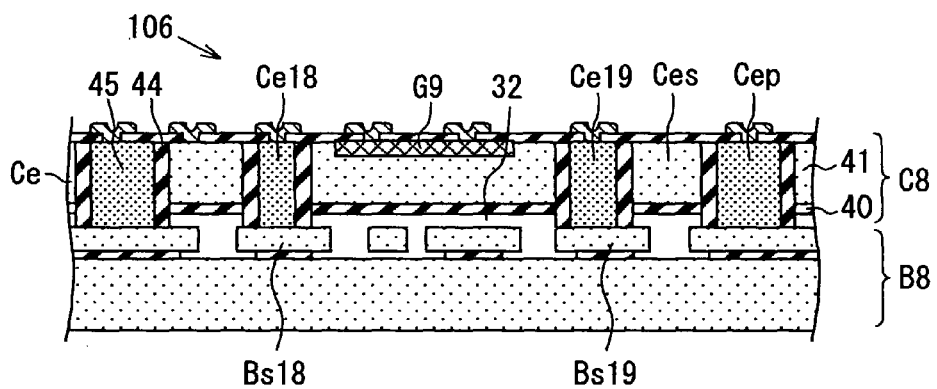
Figure 25B:
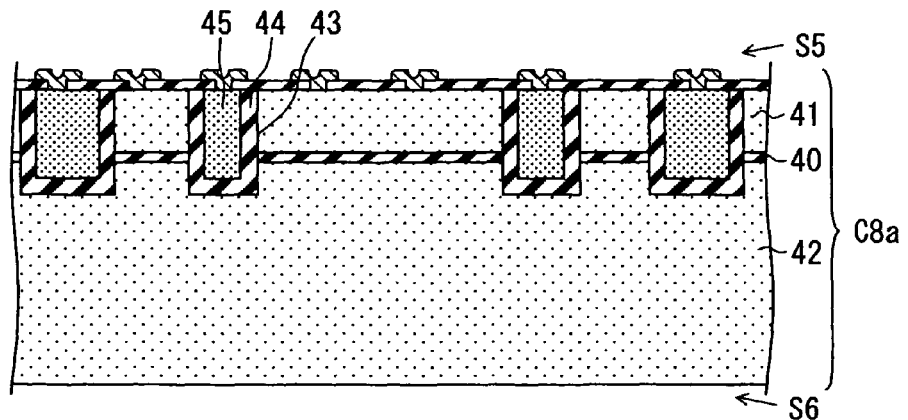

FIGS. 25A and 25B also illustrate yet another modification of the cap substrate. FIG. 25A shows a schematic cross sectional view of a semiconductor device 106 using a cap substrate C8. FIG. 25B shows a primary substrate C8a for a cap substrate preparation process before forming the cap substrate C8.

The cap substrate C8 of the semiconductor device 106 in FIG. 25A includes an embedded oxide film 40 in FIG. 25B sandwiched between an SOI layer 41 and a support substrate 42. In FIG. 25A, insulating and separating trenches 44 reach the embedded oxide film 40 and insulate and separate cap conductive regions Ce of the cap substrate C8 from adjacencies. Of the cap conductive regions Ce belonging to the cap substrate C8, one is a single-crystal conductive region Ces including the SOI layer 41 on the embedded oxide film 40. The other is a polycrystalline conductive region Cep including a polycrystalline silicon 45. The base semiconductor regions Bs18 and Bs19 of the base substrate B8 connect with the leading conductive region Ce18 and Ce19 of the cap substrate C8. The leading conductive region Ce18 and Ce19 are equivalent to the polycrystalline conductive regions Cep.

The semiconductor device 106 in FIG. 25A uses an SOI substrate for the cap substrate C8. On the other hand, the semiconductor device 105 in FIG. 24 uses the single-crystal silicon substrate 30 for the cap substrate C7. The semiconductor device 106 can accelerate and densely package various semiconductor elements and an IC circuit G9 formed on the cap substrate C8, for example.

The cap substrate C7 for the semiconductor device 105 in FIG. 24 uses the single-crystal silicon substrate 30. All the cap conductive regions Ce separated by the insulating and separating trenches 31 are made of single-crystal silicon. For this reason, the leading conductive regions Ce16 and Ce17 are processed by phosphorus (P) or arsenic (As) ion implantation to decrease resistance values for the regions. On the other hand, the cap substrate C8 for the semiconductor device 106 in FIG. 24A includes the single-crystal conductive region Ces made of the single-crystal silicon (SOI layer 41) and the polycrystalline conductive region Cep made of the polycrystalline silicon 45. The leading conductive regions Ce18 and Ce19 correspond to the polycrystalline conductive regions Cep. The polycrystalline conductive region Cep provides a high impurity density independently of an impurity density of the SOI layer 41 (single-crystal conductive region Ces) forming the IC circuit G9. The polycrystalline conductive regions Cep can optimally function as the leading conductive regions Ce18 and Ce19. It may be preferable to embed a metal such as aluminum, copper, or tungsten instead of the polycrystalline silicon 45.

The cap substrate C8 in FIG. 25A is formed from the primary substrate C8a in FIG. 25B as follows. As shown in FIG. 25B, an SOI substrate is prepared as the primary substrate C8a by sandwiching the embedded oxide film 40 between an SOI layer 41 and the support substrate 42. A trench 43 having a given depth is formed on a surface S5 corresponding to the SOI layer 41 so as to pierce the embedded oxide film 40. A sidewall oxidation film 44 is formed for the trench 43 that is then embedded with the polycrystalline silicon 45. The sidewall oxidation film 44 is finally formed into the insulating and separating trench 44 in FIG. 25A. An etching process is applied to the surface S6 of the primary substrate C8a in FIG. 25B to expose edges of the embedded oxide film 40 and the sidewall oxidation film 44. The process removes the support substrate 42 and forms the recess 32 for the cap substrate C8 in FIG. 25A. The primary substrate C8a is ground from the surface S6 to expose the edge of the polycrystalline silicon 45 embedded in the trench 43.

The above-mentioned processes prepare the cap substrate C8 in FIG. 25A.

The base substrate B8 and the cap substrate C8 are subsequently bonded to each other in accordance with the processes as described with reference to FIGS. 6A and 6B.

FIG. 25B illustrates how to prepare the cap substrate C8 using the SOI substrate for the primary substrate C8a. Obviously, a single-crystal silicon substrate can be used for the primary substrate. The same method can be used to prepare the cap substrate C8 in FIG. 25A. In this case, the embedded oxide film 40 is not formed for the primary substrate and is therefore is formed after the recess 32 is formed for the cap substrate C8.

As mentioned above, the semiconductor devices and their manufacturing methods use the sealing cap on elements of the base substrate so as to protect various elements formed on the surface layer of the semiconductor base substrate. The semiconductor devices and their manufacturing methods can embody miniaturization, inexpensive manufacture, and face down bonding to reduce mounting restrictions. The above-mentioned description uses the single semiconductor device as a representative sample for ease of understanding. Generally, the semiconductor devices are manufactured in units of a wafer containing one or more semiconductor devices.

The above disclosure has the following aspects.

According to a first aspect of the present disclosure, a semiconductor device includes: a first substrate made of semiconductor and having a plurality of first regions, wherein the first regions are insulated from each other and disposed in a surface portion of the first substrate, and wherein each first region is a semiconductor region; and a second substrate having electric conductivity and having a plurality of second regions and a plurality of insulation trenches, wherein each insulation trench penetrates the second substrate so that the second regions are insulated from each other, and wherein each second region is a conductive region. The first substrate provides a base substrate, and the second substrate provides a cap substrate. The second substrate is bonded to the first substrate so that a sealed space is provided between a predetermined surface region of the first substrate and the second substrate, and the second regions include an extraction conductive region, which is coupled with a corresponding first region.

In the device, the cap substrate covers and protects the predetermined surface region of the first substrate, on which various elements are to be formed. One side of the extraction conductive region is bonded to the first region, and the other side of the extraction conductive region is exposed to the outside of the device so that, for example, a bonding wire or a face down bonding member (i.e., a bonding ball) may be connected to the other side of the extraction conductive region. Thus, various elements on the first region can be coupled with an external circuit through the extraction conductive region without forming a through hole for the bonding wire. Accordingly, dimensions of the device can be minimized, and a manufacturing cost of the device is reduced. Further, the second substrate is not a layer on the first substrate but an independent substrate. Accordingly, a thickness of the second substrate can be set appropriately so that strength of the second substrate can be secured. Further, the second substrate can be easily processed by a conventional processing method, so that the manufacturing cost of the device is also reduced.

Alternatively, the second substrate may further include a concavity, which faces the predetermined surface region of the first substrate, and the second substrate is bonded to the first substrate at a periphery of the concavity. Further, the second substrate may further include an insulation film, which is disposed on a predetermined position of the concavity. In this case, even if moisture or unwanted material exists in the sealed space, the insulation film prevent from short-circuiting.

Alternatively, the first substrate may further include a conductive convexity, which is disposed on one of the first regions of the first substrate, and the second substrate is bonded to the conductive convexity of the first substrate. In this case, the bonding surface of the second substrate can be flattened. Further, the conductive convexity may be made of single crystal silicon, poly-crystal silicon or metal.

Alternatively, the second substrate may further include a conductive convexity on one of the second regions. The conductive convexity faces a corresponding first region of the first substrate, and the conductive convexity of the second substrate is bonded to the first substrate. Further, the conductive convexity may provide a first wiring pattern, which is electrically coupled with the one of the second regions through an insulation film. Furthermore, the second substrate may be one of a plurality of second substrates. Each second substrate further includes a second wiring pattern, which is disposed on a side opposite to the first wiring pattern, and the plurality of second substrates is stacked on the first substrate. In this case, multiple first and second substrates provide a three-dimensional circuit.

Alternatively, the first substrate may be made of single crystal silicon. In this case, multiple first regions can be made of a PN junction.

Alternatively, the first substrate may be made of a SOI substrate having a SOI layer, an embedded oxide film and a silicon substrate, which are stacked in this order. The first regions are disposed in the SOI layer, and the first regions are insulated from each other with a separation trench, which reaches to the embedded oxide film. Further, the semiconductor device may further include: a physical quantity sensor having a movable electrode and a fixed electrode for detecting a physical quantity applied to the sensor. One of the plurality of first regions provides a movable semiconductor region, and another one of the plurality of first regions provides a fixed semiconductor region. The movable semiconductor region has the movable electrode. The embedded oxide film under the movable electrode is removed by a sacrifice etching method so that the movable electrode is displaceable and separated from the silicon substrate. The fixed semiconductor region has the fixed electrode, which faces the movable electrode. The movable electrode and the fixed electrode provide a capacitance therebetween in such a manner that a space between the movable electrode and the fixed electrode provides a dielectric layer. The second regions further include a first extraction conductive region and a second extraction conductive region. The first extraction conductive region is coupled with the movable semiconductor region, and the second extraction conductive region is coupled with the fixed semiconductor region. The movable electrode is displaceable in accordance with the applied physical quantity along with a direction perpendicular to the first substrate, and the sensor detects the physical quantity by measuring capacitance change according to displacement of the movable electrode. Furthermore, the physical quantity may be acceleration or angular speed. In the above cases, the physical quantity sensor is protected by the cap substrate.

Further, the semiconductor device may further include: a MEMS resonant device having a resonant element. One of the plurality of first regions provides a resonant semiconductor region. The resonant semiconductor region has the resonant element. The embedded oxide film under the resonant element is removed by a sacrifice etching method so that the resonant element is displaceable and separated from the silicon substrate. The resonant element is disposed in the sealed space, and the resonant element is energized from the extraction conductive region so that the resonant element resonates and generates a voltage having a predetermined frequency. In this case, the manufacturing cost of the device is reduced, and the dimensions of the device is also reduced, compared with a conventional quartz-crystal resonator.

Alternatively, the semiconductor device may further include: an infrared sensor for detecting an infrared light. The infrared sensor is disposed on the predetermined surface region of the first substrate. The infrared sensor outputs an output voltage corresponding to the infrared light, and the output voltage is output through the extraction conductive region.

Alternatively, the semiconductor device may further include: a magnetic sensor for detecting a magnetic field. The magnetic sensor is disposed on the predetermined surface region of the first substrate. The magnetic sensor is disposed in the sealed space. The magnetic sensor outputs an output voltage corresponding to the magnetic field, and the output voltage is output through the extraction conductive region.

Alternatively, the semiconductor device may further include: an IC circuit disposed on the predetermined surface region of the first substrate. The IC circuit is electrically coupled with an external circuit through the extraction conductive region. In this case, the IC circuit is protected with the cap substrate in such a manner that the IC circuit is sealed without contacting the cap substrate. Thus, the IC circuit is prevented from being affected by, for example, external stress, compared with a case where a IC circuit is protected by a cover film.

Alternatively, the second substrate may be made of single silicon. In this case, a semiconductor element can be formed on the second substrate.

Alternatively, the plurality of first regions may include a single crystal conductive region and a poly-crystal conductive region. The single crystal conductive region is made of single crystal silicon, and the poly-crystal conductive region is made of poly crystal silicon, and the extraction conductive region is made of poly crystal silicon.

Alternatively, the second substrate may be made of a SOI substrate having a SOI layer, an embedded oxide film and a silicon substrate, which are stacked in this order. The second regions are insulated from each other with a separation trench, which reaches to the embedded oxide film. Further, the plurality of second regions may include a single crystal conductive region and a poly crystal conductive region. The single crystal conductive region is disposed in the SOI layer, and made of single crystal silicon, and the poly-crystal conductive region is made of poly-crystal silicon, and the extraction conductive region is made of poly-crystal silicon. In this case, a semiconductor element on the cap substrate made of the SOI substrate has high switching speed and high integration.

Further, the semiconductor device may further include: an IC circuit disposed on one of the plurality of second regions. The IC circuit is disposed opposite to the first substrate.

Alternatively, the extraction conductive region may be surrounded with at least one of the plurality of second regions, and the one of the plurality of second regions has an electric potential, which is fixed to a predetermined potential. Further, the predetermined potential may be a ground potential. in this case, the one of the second regions having the ground potential functions as a shield.

Alternatively, the first substrate and the second substrate may be made of silicon, and the first substrate and the second substrate are bonded to each other with a silicon direct bonding structure. In this case, the first and second substrates are strongly bonded with having conductivity. Further, the sealed space is completely sealed. The silicon direct bonding may be performed at a room temperature or a high temperature.

Alternatively, the first substrate and the second substrate may be made of silicon, and the first substrate and the second substrate are bonded to each other with a silicon-gold eutectic bonding structure. In this case, the first and second substrates are strongly bonded with having conductivity. Further, the sealed space is completely sealed.

Alternatively, the first substrate and the second substrate may be bonded to each other with a conductive adhesive.

According to a second aspect of the present disclosure, a method for manufacturing a semiconductor device includes: preparing a first substrate made of semiconductor, wherein the first substrate includes a plurality of first regions, which are insulated from each other and disposed in a surface portion of the first substrate, and wherein each first region is a semiconductor region; preparing a second substrate having electric conductivity and including a plurality of second regions and a plurality of insulation trenches, wherein each insulation trench penetrates the second substrate so that the second regions are insulated from each other, and wherein each second region is a conductive region; bonding the second substrate to the first substrate so that a sealed space is formed between a predetermined surface region of the first substrate and the second substrate; and electrically coupling one of the second regions and a corresponding one of the first regions so that the one of the second regions provides an extraction conductive region. The first substrate provides a base substrate, and the second substrate provides a cap substrate.

The above method provides the semiconductor device, dimensions of which can be minimized, and a manufacturing cost of the device is reduced. Further, strength of the second substrate can be secured. Further, the second substrate can be easily processed by a conventional processing method, so that the manufacturing cost of the device is also reduced.

Alternatively, the preparing the second substrate may include: forming a concavity on a first side of the second substrate so as to face the predetermined surface region of the first substrate; forming a plurality of primary trenches on the first side of the second substrate, wherein each primary trench has a predetermined depth; and grinding a second side of the second substrate until a bottom of the primary trench is exposed from the second side of the second substrate, wherein the exposed primary trench provides the insulation trench. The bonding the second substrate to the first substrate may include: arranging the concavity of the second substrate to face the predetermined surface region of the first substrate; and bonding the second substrate to the first substrate at a periphery of the concavity.

Alternatively, the preparing the second substrate may include: forming a plurality of primary trenches on a first side of the second substrate, wherein each primary trench has a predetermined depth; grinding a second side of the second substrate until a bottom of the primary trench is exposed from the second side of the second substrate, wherein the exposed primary trench provides the insulation trench; and forming a concavity on the second side of the second substrate so as to face the predetermined surface region of the first substrate after the grinding the second side of the second substrate. The bonding the second substrate to the first substrate includes: arranging the concavity of the second substrate to face the predetermined surface region of the first substrate; and bonding the second substrate to the first substrate at a periphery of the concavity.

Alternatively, the second substrate may be made of single crystal silicon. The preparing the second substrate may include: forming a plurality of primary trenches on a first side of the second substrate, wherein each primary trench has a predetermined depth; forming a sidewall oxide film on a sidewall of each primary trench; forming a poly crystal silicon film on the sidewall oxide film in each primary trench so as to fill the primary trench with the poly crystal silicon film; grinding a second side of the second substrate until a bottom of the poly crystal silicon film in each primary trench is exposed from the second side of the second substrate, wherein the exposed primary trench with the sidewall oxide film provides the insulation trench; and forming a concavity on the second side of the second substrate so as to face the predetermined surface region of the first substrate after the grinding the second side of the second substrate. The bonding the second substrate to the first substrate may include: arranging the concavity of the second substrate to face the predetermined surface region of the first substrate; and bonding the second substrate to the first substrate at a periphery of the concavity.

Alternatively, the second substrate may be made of a SOI substrate having a SOI layer, an embedded oxide film and a silicon substrate, which are stacked in this order. The preparing the second substrate may include: forming a plurality of primary trenches in the SOI layer on a first side of the second substrate, wherein each primary trench penetrates the SOI layer and the embedded oxide film; forming a sidewall oxide film on a sidewall of each primary trench; forming a poly crystal silicon film on the sidewall oxide film in each primary trench so as to fill the primary trench with the poly crystal silicon film; etching a second side of the second substrate until the embedded oxide film and the sidewall oxide film in each primary trench is exposed from the second side of the second substrate, wherein the etching the second side of the second substrate provides to form a concavity on the second side of the second substrate so as to face the predetermined surface region of the first substrate; and grinding the second side of the second substrate until a bottom of the poly crystal silicon film in each primary trench is exposed from the second side of the second substrate, wherein the exposed primary trench with the oxide film provides the insulation trench. The bonding the second substrate to the first substrate may include: arranging the concavity of the second substrate to face the predetermined surface region of the first substrate; and bonding the second substrate to the first substrate at a periphery of the concavity.

Alternatively, the preparing the first substrate may include: forming the plurality of first regions in the surface portion of the first substrate; and forming a conductive convexity on one of the first regions. In the bonding the second substrate to the first substrate, the second substrate is bonded to the conductive convexity of the first substrate.

Alternatively, the preparing the second substrate may include: forming a plurality of primary trenches on a first side of the second substrate, wherein each primary trench has a predetermined depth; grinding a second side of the second substrate until a bottom of the primary trench is exposed from the second side of the second substrate, wherein the exposed primary trench provides the insulation trench; and forming a convexity on one of the second regions so as to face a corresponding first region of the first substrate. In the bonding the second substrate to the first substrate, the conductive convexity of the second substrate is bonded to the first substrate. Further, the forming the convexity may provide to form a wiring pattern, which is electrically coupled with the one of the second regions through an insulation film.

Alternatively, the first substrate and the second substrate may be made of silicon, and, in the bonding the second substrate to the first substrate, the first substrate and the second substrate are bonded to each other with a silicon direct bonding structure.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A manufacturing method, comprising:
preparing the base substrate;
preparing the cap substrate;
bonding the cap substrate on the base substrate through the conductive film so that the sealed space is formed; and
electrically coupling the extraction conductive region with a corresponding base semiconductor region through the conductive film,
wherein the semiconductor device includes
a base substrate made of a SOI substrate having a SOI layer, an embedded oxide film and a silicon substrate, which are stacked in this order;
a plurality of first trenches disposed on the SOI layer and reaching the embedded oxide film;
a plurality of base semiconductor regions disposed in the SOI layer and insulated from each other with the plurality of first trenches, wherein at least one of the plurality of base semiconductor regions is a movable semiconductor region having a movable electrode, and wherein at least another one of the plurality of base semiconductor regions is a fixed semiconductor region having a fixed electrode, which faces the movable electrode;
a physical quantity sensor provided by the movable electrode and the fixed electrode for detecting a physical quantity based on a capacitance between the movable electrode and the fixed electrode, wherein the movable electrode is movable according to the physical quantity applied to the sensor so that a distance between the movable electrode and the fixed electrode is changeable;

a cap substrate made of single crystal silicon and having electric conductivity;

a plurality of second trenches, which penetrate the cap substrate;

a plurality of cap conductive regions made of single crystal silicon and insulated from each other with the plurality of second trenches; and a conductive film disposed between the base substrate and the cap substrate so that the base substrate and the cap substrate are bonded to each other, wherein a sealed space is provided between the base substrate and the cap substrate, wherein the physical quantity sensor is sealed in the sealed space, wherein a predetermined number of the cap conductive regions are electrically coupled with corresponding base semiconductor regions through the conductive film so that the predetermined number of the cap conductive regions provide a predetermined number of extraction conductive regions, wherein the movable semiconductor region is coupled with one extraction conductive region, and the fixed semiconductor region is coupled with another extraction conductive region, and wherein each extraction conductive region is exposed on a side of the cap substrate, which is opposite to the base substrate, wherein the preparing the cap substrate includes:
  forming a concavity on one side of a primary substrate, which faces the base substrate;
  forming a plurality of primary insulation trenches on the one side of the primary substrate, wherein each primary insulation trench has a predetermined depth; and
  grinding the other side of the primary substrate, which is opposite to the one side so that one end of each of the primary insulation trenches is exposed on the other side, wherein each of the primary insulation trenches provides a corresponding second trench, and the primary substrate provides the cap substrate, and wherein a periphery of the cap substrate around the concavity is bonded to the base substrate.

2. A manufacturing method, comprising:
preparing the base substrate;
preparing the cap substrate;
bonding the cap substrate on the base substrate through the conductive film so that the sealed space is formed; and
electrically coupling the extraction conductive region with a corresponding base semiconductor region through the conductive film,
wherein the semiconductor device includes
  a base substrate made of a SOI substrate having a SOI layer, an embedded oxide film and a silicon substrate, which are stacked in this order;
  a plurality of first trenches disposed on the SOI layer and reaching the embedded oxide film;
  a plurality of base semiconductor regions disposed in the SOI layer and insulated from each other with the plurality of first trenches, wherein at least one of the plurality of base semiconductor regions is a movable semiconductor region having a movable electrode, and wherein at least another one of the plurality of base semiconductor regions is a fixed semiconductor region having a fixed electrode, which faces the movable electrode;
  a physical quantity sensor provided by the movable electrode and the fixed electrode for detecting a physical quantity based on a capacitance between the movable electrode and the fixed electrode, wherein the movable electrode is movable according to the physical quantity applied to the sensor so that a distance between the movable electrode and the fixed electrode is changeable;
  a cap substrate made of single crystal silicon and having electric conductivity;
  a plurality of second trenches, which penetrate the cap substrate;
  a plurality of cap conductive regions made of single crystal silicon and insulated from each other with the plurality of second trenches; and
  a conductive film disposed between the base substrate and the cap substrate so that the base substrate and the cap substrate are bonded to each other,
wherein a sealed space is provided between the base substrate and the cap substrate,
wherein the physical quantity sensor is sealed in the sealed space,
wherein a predetermined number of the cap conductive regions are electrically coupled with corresponding base semiconductor regions through the conductive film so that the predetermined number of the cap conductive regions provide a predetermined number of extraction conductive regions,
wherein the movable semiconductor region is coupled with one extraction conductive region, and the fixed semiconductor region is coupled with another extraction conductive region, and
wherein each extraction conductive region is exposed on a side of the cap substrate, which is opposite to the base substrate,
wherein the preparing the cap substrate includes:
  forming a plurality of primary insulation trenches on one side of a primary substrate, wherein each primary insulation trench has a predetermined depth;
  grinding the other side of the primary substrate, which is opposite to the one side, so that one end of the primary insulation trench is exposed on the other side; and
  forming a concavity on the other side of the primary substrate, which faces the base substrate, after the grinding,
wherein each of the primary insulation trenches provides a corresponding second trench, and the primary substrate provides the cap substrate, and
wherein a periphery of the cap substrate around the concavity is bonded to the base substrate.

* * * * *